United States Patent
Nielsen et al.

(10) Patent No.: US 8,583,264 B2
(45) Date of Patent: Nov. 12, 2013

(54) MARKING DEVICE DOCKING STATIONS AND METHODS OF USING SAME

(75) Inventors: Steven E. Nielsen, North Palm Beach, FL (US); Curtis Chambers, Palm Beach Gardens, FL (US); Jeffrey Farr, Jupiter, FL (US)

(73) Assignee: CertusView Technologies, LLC, Palm Beach Gardens, FL (US)

( * ) Notice: Subject to any disclaimer, the term of this patent is extended or adjusted under 35 U.S.C. 154(b) by 566 days.

(21) Appl. No.: 12/571,411

(22) Filed: Sep. 30, 2009

(65) Prior Publication Data

US 2010/0085694 A1    Apr. 8, 2010

Related U.S. Application Data

(60) Provisional application No. 61/102,115, filed on Oct. 2, 2008.

(51) Int. Cl.
- *H05K 5/00* (2006.01)
- *H05K 7/00* (2006.01)
- *G06F 1/16* (2006.01)
- *G05B 19/18* (2006.01)

(52) U.S. Cl.
USPC .................... 700/58; 361/679.01; 361/679.02; 700/56

(58) Field of Classification Search
USPC ............ 361/679.02, 679.33, 679.35, 679.41, 361/679.01; 700/56, 58
See application file for complete search history.

(56) References Cited

U.S. PATENT DOCUMENTS

| | | |
|---|---|---|
| 3,988,922 A | 11/1976 | Clark et al. |
| 4,623,282 A | 11/1986 | Allen |
| 4,899,293 A | 2/1990 | Dawson et al. |
| 4,989,151 A | 1/1991 | Nuimura |
| 5,150,295 A | 9/1992 | Mattingly |
| 5,214,757 A | 5/1993 | Mauney et al. |
| 5,293,911 A | 3/1994 | Akeel |
| 5,299,300 A | 3/1994 | Femal |
| 5,329,464 A | 7/1994 | Sumic et al. |
| 5,379,045 A | 1/1995 | Gilbert et al. |
| 5,381,338 A | 1/1995 | Wysocki |

(Continued)

FOREIGN PATENT DOCUMENTS

| | | |
|---|---|---|
| CA | 2623761 | 10/2008 |
| CA | 2623466 | 6/2011 |

(Continued)

OTHER PUBLICATIONS

Co-pending U.S. Appl. No. 12/571,401, filed Sep. 30, 2009.

(Continued)

*Primary Examiner* — Anthony Haughton

(57) ABSTRACT

Docking stations and docking methods are provided for use with marking devices used for marking the presence or absence of an underground facility in a dig area. The docking station may serve as a home base for storage of a marking device, for charging the battery of a marking device, for transferring data to and from a marking device, and for securing a marking device against unauthorized use and/or theft. The docking station may be a mobile docking station that is installed in a vehicle or may be a fixed docking station that is installed at a central location in the field, at a central office, at a home base facility, and the like.

36 Claims, 22 Drawing Sheets

(56) References Cited

U.S. PATENT DOCUMENTS

| | | |
|---|---|---|
| 5,389,149 A | 2/1995 | Carey et al. |
| 5,467,271 A | 11/1995 | Abel et al. |
| 5,486,067 A | 1/1996 | Huynh et al. |
| 5,490,646 A | 2/1996 | Shaw |
| 5,517,419 A | 5/1996 | Lanckton |
| 5,529,433 A * | 6/1996 | Huynh et al. .................. 404/94 |
| 5,553,407 A | 9/1996 | Stump |
| 5,659,985 A | 8/1997 | Stump |
| 5,673,050 A | 9/1997 | Moussally et al. |
| 5,689,415 A | 11/1997 | Calotychos et al. |
| 5,699,244 A | 12/1997 | Clark, Jr. |
| 5,704,142 A | 1/1998 | Stump |
| 5,751,450 A | 5/1998 | Robinson |
| 5,769,370 A | 6/1998 | Ashjaee |
| 5,819,859 A | 10/1998 | Stump et al. |
| 5,848,373 A | 12/1998 | Delorme et al. |
| 5,918,565 A | 7/1999 | Casas |
| 6,026,135 A | 2/2000 | McFee et al. |
| 6,037,010 A | 3/2000 | Kahmann et al. |
| 6,053,260 A | 4/2000 | Boon |
| 6,064,940 A | 5/2000 | Rodgers |
| 6,074,693 A | 6/2000 | Manning |
| 6,075,481 A | 6/2000 | Eslambolchi |
| 6,079,114 A | 6/2000 | Toews |
| 6,095,081 A | 8/2000 | Gochenour |
| 6,119,376 A | 9/2000 | Stump |
| 6,138,906 A | 10/2000 | DeMayo |
| 6,140,798 A | 10/2000 | Krieger |
| 6,188,392 B1 * | 2/2001 | O'Connor et al. ............ 345/179 |
| 6,240,360 B1 | 5/2001 | Phelan |
| 6,282,477 B1 | 8/2001 | Gudat et al. |
| 6,285,911 B1 * | 9/2001 | Watts et al. .................. 700/2 |
| 6,292,108 B1 | 9/2001 | Straser et al. |
| 6,294,022 B1 | 9/2001 | Eslambolchi et al. |
| 6,299,934 B1 | 10/2001 | Manning |
| 6,320,518 B2 | 11/2001 | Saeki et al. |
| RE37,574 E | 3/2002 | Rawlins |
| 6,360,931 B1 | 3/2002 | Morford |
| 6,375,038 B1 | 4/2002 | Daansen et al. |
| 6,388,629 B1 | 5/2002 | Albats et al. |
| 6,390,336 B1 | 5/2002 | Orozco |
| 6,401,051 B1 | 6/2002 | Merriam |
| 6,437,708 B1 | 8/2002 | Brouwer |
| 6,438,239 B1 | 8/2002 | Kuechen |
| 6,477,588 B1 * | 11/2002 | Yerazunis et al. ............. 710/13 |
| 6,512,478 B1 | 1/2003 | Chien |
| 6,526,400 B1 | 2/2003 | Takata |
| 6,557,738 B1 | 5/2003 | Meintzer |
| 6,650,293 B1 | 11/2003 | Eslambolchi |
| 6,658,148 B1 | 12/2003 | Fung |
| 6,686,910 B2 | 2/2004 | O'Donnell |
| 6,700,526 B2 | 3/2004 | Witten |
| 6,710,741 B2 | 3/2004 | Tucker |
| 6,723,375 B2 | 4/2004 | Zeck et al. |
| 6,751,552 B1 | 6/2004 | Minelli |
| 6,751,553 B2 | 6/2004 | Young |
| 6,778,128 B2 | 8/2004 | Tucker et al. |
| 6,798,379 B2 | 9/2004 | Tucker et al. |
| 6,825,793 B2 | 11/2004 | Taylor, Jr. et al. |
| 6,833,795 B1 | 12/2004 | Johnson et al. |
| 6,850,161 B1 | 2/2005 | Elliott et al. |
| 6,898,525 B1 | 5/2005 | Minelli |
| 6,904,361 B1 | 6/2005 | Tallman et al. |
| 6,938,048 B1 | 8/2005 | Jilk et al. |
| 6,941,890 B1 | 9/2005 | Cristo et al. |
| 6,947,028 B2 | 9/2005 | Shkolnikov |
| 6,956,564 B1 * | 10/2005 | Williams ..................... 345/179 |
| 6,972,698 B2 | 12/2005 | Deguchi |
| 6,973,291 B1 | 12/2005 | Bellows |
| 6,975,942 B2 | 12/2005 | Young et al. |
| 6,999,021 B2 | 2/2006 | Taylor, Jr. |
| 7,009,399 B2 | 3/2006 | Olsson et al. |
| 7,048,320 B2 | 5/2006 | Rubel et al. |
| 7,269,002 B1 | 9/2007 | Turner et al. |
| 7,319,387 B2 | 1/2008 | Willson et al. |
| 7,372,247 B1 | 5/2008 | Giusti et al. |
| 7,400,976 B2 | 7/2008 | Young et al. |
| 7,443,154 B1 | 10/2008 | Merewether et al. |
| 7,451,721 B1 | 11/2008 | Garza et al. |
| 7,482,973 B2 | 1/2009 | Tucker et al. |
| 7,532,127 B2 | 5/2009 | Holman et al. |
| 7,636,901 B2 | 12/2009 | Munson |
| 7,640,105 B2 | 12/2009 | Nielsen et al. |
| 7,664,530 B2 | 2/2010 | Skelton |
| 7,733,077 B1 | 6/2010 | Merewether et al. |
| 7,773,095 B1 | 8/2010 | Badrak et al. |
| 7,834,801 B2 | 11/2010 | Waite et al. |
| 7,834,806 B2 | 11/2010 | Tucker et al. |
| 7,889,124 B2 | 2/2011 | Islam et al. |
| 7,889,888 B2 | 2/2011 | Deardorr |
| 7,929,981 B2 | 4/2011 | Sangberg |
| 7,978,129 B2 | 7/2011 | Sawyer et al. |
| 7,986,246 B2 | 7/2011 | Angelis et al. |
| 8,081,112 B2 | 12/2011 | Tucker et al. |
| 8,106,660 B1 | 1/2012 | Merewether et al. |
| 8,118,192 B2 | 2/2012 | Daugherty |
| 8,144,245 B2 | 3/2012 | Vik |
| 8,155,390 B2 | 4/2012 | Nielsen et al. |
| 8,264,409 B2 | 9/2012 | Miller |
| 8,311,765 B2 | 11/2012 | Nielsen et al. |
| 8,424,486 B2 | 4/2013 | Nielsen et al. |
| 8,473,148 B2 | 6/2013 | Nielsen et al. |
| 8,480,332 B2 | 7/2013 | Nielsen et al. |
| 2002/0035432 A1 | 3/2002 | Kubica et al. |
| 2002/0053608 A1 | 5/2002 | Zeck et al. |
| 2002/0103625 A1 | 8/2002 | Card et al. |
| 2002/0115472 A1 | 8/2002 | Andress |
| 2002/0122000 A1 | 9/2002 | Bradley et al. |
| 2002/0130906 A1 | 9/2002 | Miyaki |
| 2002/0146272 A1 | 10/2002 | Conover |
| 2003/0012411 A1 | 1/2003 | Sjostrom |
| 2003/0080897 A1 | 5/2003 | Tranchina |
| 2003/0100316 A1 | 5/2003 | Odamura |
| 2003/0135328 A1 | 7/2003 | Burns et al. |
| 2003/0168834 A1 | 9/2003 | Ulrich |
| 2003/0196585 A1 | 10/2003 | McDonald et al. |
| 2004/0006425 A1 | 1/2004 | Wood |
| 2004/0051368 A1 | 3/2004 | Caputo |
| 2004/0057795 A1 | 3/2004 | Mayfield et al. |
| 2004/0070535 A1 | 4/2004 | Olsson et al. |
| 2004/0124988 A1 | 7/2004 | Leonard et al. |
| 2004/0210370 A1 | 10/2004 | Gudat |
| 2004/0220731 A1 | 11/2004 | Tucker |
| 2004/0225444 A1 | 11/2004 | Young et al. |
| 2005/0023367 A1 | 2/2005 | Reighard |
| 2005/0034074 A1 | 2/2005 | Munson |
| 2005/0038825 A1 | 2/2005 | Tarabzouni |
| 2005/0040222 A1 | 2/2005 | Robinson |
| 2005/0054457 A1 | 3/2005 | Eyestone et al. |
| 2005/0150399 A1 | 7/2005 | Wiley |
| 2005/0156600 A1 | 7/2005 | Olsson |
| 2005/0192727 A1 | 9/2005 | Shostak et al. |
| 2005/0206562 A1 | 9/2005 | Willson et al. |
| 2005/0232475 A1 | 10/2005 | Floeder |
| 2006/0026020 A1 | 2/2006 | Waite et al. |
| 2006/0055584 A1 | 3/2006 | Waite et al. |
| 2006/0077095 A1 | 4/2006 | Tucker et al. |
| 2006/0085133 A1 | 4/2006 | Young |
| 2006/0085396 A1 | 4/2006 | Evans |
| 2006/0169776 A1 | 8/2006 | Hornbaker |
| 2006/0220955 A1 | 10/2006 | Hamilton |
| 2006/0262963 A1 | 11/2006 | Navulur |
| 2006/0276198 A1 | 12/2006 | Michelon et al. |
| 2006/0276985 A1 | 12/2006 | Xu |
| 2006/0282191 A1 | 12/2006 | Gotfried |
| 2006/0282280 A1 | 12/2006 | Stotz et al. |
| 2006/0289679 A1 | 12/2006 | Johnson et al. |
| 2007/0031042 A1 | 2/2007 | Simental |
| 2007/0040558 A1 | 2/2007 | Overby et al. |
| 2007/0219722 A1 | 9/2007 | Sawyer |
| 2007/0223803 A1 | 9/2007 | Shindo |
| 2007/0268110 A1 | 11/2007 | Little |
| 2007/0286021 A1 | 12/2007 | Hoenmans et al. |
| 2008/0010009 A1 | 1/2008 | Miyoshi |

(56) References Cited

U.S. PATENT DOCUMENTS

| | | |
|---|---|---|
| 2008/0013940 A1 | 1/2008 | Jung |
| 2008/0084212 A1 | 4/2008 | Wieland |
| 2008/0180322 A1 | 7/2008 | Islam |
| 2008/0204322 A1 | 8/2008 | Oswald et al. |
| 2008/0208415 A1 | 8/2008 | Vik |
| 2008/0245299 A1 | 10/2008 | Nielsen et al. |
| 2008/0255795 A1 | 10/2008 | Shkolnikov |
| 2008/0310721 A1 | 12/2008 | Yang |
| 2009/0004410 A1 | 1/2009 | Thomson et al. |
| 2009/0013928 A1 | 1/2009 | Nielsen et al. |
| 2009/0063258 A1 | 3/2009 | Mueller et al. |
| 2009/0109081 A1 | 4/2009 | Ryerson |
| 2009/0121933 A1 | 5/2009 | Tucker et al. |
| 2009/0149894 A1 | 6/2009 | Merry et al. |
| 2009/0157746 A1 | 6/2009 | More et al. |
| 2009/0171616 A1 | 7/2009 | Zhang et al. |
| 2009/0185858 A1 | 7/2009 | Malit |
| 2009/0201178 A1 | 8/2009 | Nielsen et al. |
| 2009/0201311 A1 | 8/2009 | Nielsen et al. |
| 2009/0202101 A1 | 8/2009 | Nielsen et al. |
| 2009/0202110 A1 | 8/2009 | Nielsen et al. |
| 2009/0202111 A1 | 8/2009 | Nielsen et al. |
| 2009/0202112 A1 | 8/2009 | Nielsen et al. |
| 2009/0204238 A1 | 8/2009 | Nielsen et al. |
| 2009/0204466 A1 | 8/2009 | Nielsen et al. |
| 2009/0204614 A1 | 8/2009 | Nielsen et al. |
| 2009/0204625 A1 | 8/2009 | Nielsen et al. |
| 2009/0207019 A1 | 8/2009 | Nielsen et al. |
| 2009/0208642 A1 | 8/2009 | Nielsen et al. |
| 2009/0210098 A1 | 8/2009 | Nielsen et al. |
| 2009/0210245 A1 | 8/2009 | Wold |
| 2009/0210284 A1 | 8/2009 | Nielsen et al. |
| 2009/0210285 A1 | 8/2009 | Nielsen et al. |
| 2009/0210297 A1 | 8/2009 | Nielsen et al. |
| 2009/0210298 A1 | 8/2009 | Nielsen et al. |
| 2009/0237408 A1 | 9/2009 | Nielsen et al. |
| 2009/0238414 A1 | 9/2009 | Nielsen et al. |
| 2009/0238415 A1 | 9/2009 | Nielsen et al. |
| 2009/0238416 A1 | 9/2009 | Nielsen et al. |
| 2009/0238417 A1 | 9/2009 | Nielsen et al. |
| 2009/0241045 A1 | 9/2009 | Nielsen et al. |
| 2009/0241046 A1 | 9/2009 | Nielsen et al. |
| 2009/0324815 A1 | 12/2009 | Nielsen et al. |
| 2009/0327024 A1 | 12/2009 | Nielsen et al. |
| 2010/0002365 A1 | 1/2010 | Mulcahey |
| 2010/0006667 A1 | 1/2010 | Nielsen et al. |
| 2010/0010862 A1 | 1/2010 | Nielsen et al. |
| 2010/0010863 A1 | 1/2010 | Nielsen et al. |
| 2010/0010882 A1 | 1/2010 | Nielsen et al. |
| 2010/0010883 A1 | 1/2010 | Nielsen et al. |
| 2010/0045517 A1 | 2/2010 | Tucker et al. |
| 2010/0070347 A1 | 3/2010 | Chen |
| 2010/0084532 A1 | 4/2010 | Nielsen et al. |
| 2010/0085054 A1 | 4/2010 | Nielsen et al. |
| 2010/0085185 A1 | 4/2010 | Nielsen et al. |
| 2010/0085376 A1 | 4/2010 | Nielsen et al. |
| 2010/0085701 A1 | 4/2010 | Nielsen et al. |
| 2010/0086671 A1 | 4/2010 | Nielsen et al. |
| 2010/0086677 A1 | 4/2010 | Nielsen et al. |
| 2010/0088031 A1 | 4/2010 | Nielsen et al. |
| 2010/0088032 A1 | 4/2010 | Nielsen et al. |
| 2010/0088134 A1 | 4/2010 | Nielsen et al. |
| 2010/0088135 A1 | 4/2010 | Nielsen et al. |
| 2010/0088164 A1 | 4/2010 | Nielsen et al. |
| 2010/0090700 A1 | 4/2010 | Nielsen et al. |
| 2010/0090858 A1 | 4/2010 | Nielsen et al. |
| 2010/0094553 A1 | 4/2010 | Nielsen et al. |
| 2010/0097224 A1 | 4/2010 | Prodanovich |
| 2010/0117654 A1 | 5/2010 | Nielsen et al. |
| 2010/0131903 A1 | 5/2010 | Thomson et al. |
| 2010/0146454 A1 | 6/2010 | Sugahara |
| 2010/0161359 A1 | 6/2010 | Asher |
| 2010/0188088 A1 | 7/2010 | Nielsen et al. |
| 2010/0188215 A1 | 7/2010 | Nielsen et al. |
| 2010/0188216 A1 | 7/2010 | Nielsen et al. |
| 2010/0188245 A1 | 7/2010 | Nielsen et al. |
| 2010/0188407 A1 | 7/2010 | Nielsen et al. |
| 2010/0189312 A1 | 7/2010 | Nielsen et al. |
| 2010/0189887 A1 | 7/2010 | Nielsen et al. |
| 2010/0198663 A1 | 8/2010 | Nielsen et al. |
| 2010/0201690 A1 | 8/2010 | Nielsen et al. |
| 2010/0201706 A1 | 8/2010 | Nielsen et al. |
| 2010/0205031 A1 | 8/2010 | Nielsen et al. |
| 2010/0205032 A1 | 8/2010 | Nielsen et al. |
| 2010/0205195 A1 | 8/2010 | Nielsen et al. |
| 2010/0205264 A1 | 8/2010 | Nielsen et al. |
| 2010/0205536 A1 | 8/2010 | Nielsen et al. |
| 2010/0205554 A1 | 8/2010 | Nielsen et al. |
| 2010/0205555 A1 | 8/2010 | Nielsen et al. |
| 2010/0207816 A1 | 8/2010 | Islam et al. |
| 2010/0211354 A1 | 8/2010 | Park et al. |
| 2010/0228588 A1 | 9/2010 | Nielsen et al. |
| 2010/0245086 A1 | 9/2010 | Nielsen et al. |
| 2010/0247754 A1 | 9/2010 | Nielsen et al. |
| 2010/0253511 A1 | 10/2010 | Nielsen et al. |
| 2010/0253513 A1 | 10/2010 | Nielsen et al. |
| 2010/0253514 A1 | 10/2010 | Nielsen et al. |
| 2010/0255182 A1 | 10/2010 | Nielsen et al. |
| 2010/0256825 A1 | 10/2010 | Nielsen et al. |
| 2010/0256912 A1 | 10/2010 | Nielsen et al. |
| 2010/0256981 A1 | 10/2010 | Nielsen et al. |
| 2010/0257029 A1 | 10/2010 | Nielsen et al. |
| 2010/0257477 A1 | 10/2010 | Nielsen et al. |
| 2010/0259381 A1 | 10/2010 | Nielsen et al. |
| 2010/0259414 A1 | 10/2010 | Nielsen et al. |
| 2010/0262470 A1 | 10/2010 | Nielsen et al. |
| 2010/0262670 A1 | 10/2010 | Nielsen et al. |
| 2010/0263591 A1 | 10/2010 | Nielsen et al. |
| 2010/0268786 A1 | 10/2010 | Nielsen et al. |
| 2010/0272885 A1 | 10/2010 | Olsson |
| 2010/0285211 A1 | 11/2010 | Nielsen et al. |
| 2010/0318401 A1 | 12/2010 | Nielsen et al. |
| 2010/0318402 A1 | 12/2010 | Nielsen et al. |
| 2010/0318465 A1 | 12/2010 | Nielsen et al. |
| 2010/0324967 A1 | 12/2010 | Nielsen et al. |
| 2011/0006772 A1 | 1/2011 | Olsson |
| 2011/0007076 A1 | 1/2011 | Nielsen et al. |
| 2011/0020776 A1 | 1/2011 | Nielsen et al. |
| 2011/0022433 A1 | 1/2011 | Nielsen et al. |
| 2011/0035245 A1 | 2/2011 | Nielsen et al. |
| 2011/0035251 A1 | 2/2011 | Nielsen et al. |
| 2011/0035252 A1 | 2/2011 | Nielsen et al. |
| 2011/0035260 A1 | 2/2011 | Nielsen et al. |
| 2011/0035324 A1 | 2/2011 | Nielsen et al. |
| 2011/0035328 A1 | 2/2011 | Nielsen et al. |
| 2011/0040589 A1 | 2/2011 | Nielsen et al. |
| 2011/0040590 A1 | 2/2011 | Nielsen et al. |
| 2011/0045175 A1 | 2/2011 | Nielsen et al. |
| 2011/0046993 A1 | 2/2011 | Nielsen et al. |
| 2011/0046994 A1 | 2/2011 | Nielsen et al. |
| 2011/0046999 A1 | 2/2011 | Nielsen et al. |
| 2011/0060496 A1 | 3/2011 | Nielsen et al. |
| 2011/0060549 A1 | 3/2011 | Nielsen et al. |
| 2011/0093162 A1 | 4/2011 | Nielsen et al. |
| 2011/0093304 A1 | 4/2011 | Nielsen et al. |
| 2011/0093306 A1 | 4/2011 | Nielsen et al. |
| 2011/0095885 A9 | 4/2011 | Nielsen et al. |
| 2011/0117272 A1 | 5/2011 | Nielsen et al. |
| 2011/0131081 A1 | 6/2011 | Nielsen et al. |
| 2011/0137769 A1 | 6/2011 | Nielsen et al. |
| 2011/0191058 A1 | 8/2011 | Nielsen et al. |
| 2011/0236588 A1 | 9/2011 | Nielsen et al. |
| 2011/0249394 A1 | 10/2011 | Nielsen et al. |
| 2011/0279229 A1 | 11/2011 | Nielsen et al. |
| 2011/0279230 A1 | 11/2011 | Nielsen et al. |
| 2011/0279476 A1 | 11/2011 | Nielsen et al. |
| 2011/0282542 A9 | 11/2011 | Nielsen et al. |
| 2011/0283217 A1 | 11/2011 | Nielsen et al. |
| 2011/0285749 A1 | 11/2011 | Nielsen et al. |
| 2012/0019380 A1 | 1/2012 | Nielsen et al. |
| 2012/0036140 A1 | 2/2012 | Nielsen et al. |
| 2012/0065924 A1 | 3/2012 | Nielsen et al. |
| 2012/0065944 A1 | 3/2012 | Nielsen et al. |
| 2012/0066137 A1 | 3/2012 | Nielsen et al. |

(56) References Cited

U.S. PATENT DOCUMENTS

| | | | |
|---|---|---|---|
| 2012/0066273 | A1 | 3/2012 | Nielsen et al. |
| 2012/0066506 | A1 | 3/2012 | Nielsen et al. |
| 2012/0069178 | A1 | 3/2012 | Nielsen et al. |
| 2012/0072035 | A1 | 3/2012 | Nielsen et al. |
| 2012/0110019 | A1 | 5/2012 | Nielsen et al. |
| 2012/0113244 | A1 | 5/2012 | Nielsen et al. |
| 2012/0274476 | A1 | 11/2012 | Nielsen et al. |
| 2012/0328162 | A1 | 12/2012 | Nielsen et al. |
| 2012/0330849 | A1 | 12/2012 | Nielsen et al. |
| 2013/0002854 | A1 | 1/2013 | Nielsen et al. |
| 2013/0006718 | A1 | 1/2013 | Nielsen et al. |
| 2013/0044918 | A1 | 2/2013 | Nielsen et al. |
| 2013/0085670 | A1 | 4/2013 | Nielsen et al. |
| 2013/0101180 | A1 | 4/2013 | Nielsen et al. |
| 2013/0103318 | A1 | 4/2013 | Nielsen et al. |
| 2013/0116855 | A1 | 5/2013 | Nielsen et al. |
| 2013/0125042 | A1 | 5/2013 | Nielsen et al. |
| 2013/0135343 | A1 | 5/2013 | Nielsen et al. |
| 2013/0147637 | A1 | 6/2013 | Nielsen et al. |

FOREIGN PATENT DOCUMENTS

| | | |
|---|---|---|
| CH | 695087 A5 | 12/2005 |
| EP | 1679232 A1 | 7/2006 |
| EP | 1974638 | 10/2008 |
| JP | 7256169 | 10/1994 |
| JP | 7128061 | 5/1995 |
| JP | 8285601 | 11/1996 |
| JP | 10060865 | 3/1998 |
| JP | 2000501666 | 2/2000 |
| JP | 2002079167 | 3/2002 |
| WO | WO9516827 | 6/1995 |
| WO | WO0194016 | 12/2001 |
| WO | WO-00228541 | 4/2002 |
| WO | WO-2008112461 A1 | 9/2008 |

OTHER PUBLICATIONS

Co-pending U.S. Appl. No. 12/571,408, filed Sep. 30, 2009.
International Search Report and Written Opinion, Application Serial No. PCT/US2008/55798, Jul. 28, 2008.
GPS Technology Enhancing Underground Utility Locating, Underground Construction Magazine, Apr. 2010, 3 pages.
International Search Report and Written Opinion, Application Serial No. PCT/US2009/005401, Jun. 18, 2010, 18 pages.
Office Action dated Jun. 16, 2010 from Canadian Application No. 2,691,707, filed Feb. 10, 2010.
3M Dynatel, Brochure, 2006, 1-4.
3M Dynatel, Locating and Marking System, Brochure, 2007, 1-16.
Bernold, L.. et al. "Equipment operator training in the age of internet2," Proceedings of 19th International Symposium on Automation and Robotics in Construction (ISARC 2002), Sep. 2002 [retrieved on Nov. 12, 2010]. Retrieved from the Internet: <URL: http://fire.nist.gov/bfrlpubsibuild02IPDF/b02059.pdf>. p. 4, col. 2, para 2.
European Search Report, Application No. 08743671.3, Nov. 16, 2011.
U.S. Appl. No. 13/644,226, filed Oct. 3, 2012, Nielsen et al.
European Search Report, Application No. 08743673.9, Feb. 28, 2011.
International Search Report and Written Opinion, Application No. PCT/US10/45161, Oct. 29, 2010.
International Search Report and Written Opinion, Application No. PCT/US10/45409, Nov. 18, 2010.
International Search Report and Written Opinion, Application No. PCT/US10/45969, Nov. 18, 2010.
International Search Report and Written Opinion, Application No. PCT/US11/23208, Mar. 25, 2011.
International Search Report and Written Opinion, Application No. PCT/US2009/003957, Mar. 21, 2011.
International Search Report and Written Opinion, Application No. PCT/US2010/036029, Sep. 3, 2010.
International Search Report and Written Opinion, Application No. PCT/US2011/047807, Dec. 6, 2011.
Jung, H.G., Structure Analysis Based Parking Slot Marking Recognition for Semi-automatic Parking System, Springer-Verlag Berlin Heidelberg 2006, 10 pages.
Luczak, S., "Increasing Accuracy of Tilt Measurements," Engineering Mechanics, vol. 14, 2007, p. 143-154.
New Mexico's Recommended Marking Guidelines for Underground Utilities, May 2006, 8 pages.
Notice of Allowance dated Jan. 24, 2012 from U.S. Appl. No. 12/363,951.
Notice of Allowance dated Mar. 9, 2012 from U.S. Appl. No. 12/236,688.
Notice of Allowance dated May 2, 2012 from U.S. Appl. No. 12/429,929.
Notice of Allowance dated Jul. 12, 2012 from U.S. Appl. No. 12/539,497.
Notice of Allowance dated Aug. 1, 2012 from U.S. Appl. No. 12/364,339.
Notice of Allowance dated Aug. 25, 2011 from U.S. Appl. No. 11/696,606.
Notice of Allowance dated Sep. 5, 2012 from U.S. Appl. No. 12/854,370.
Notice of Allowance dated Oct. 1, 2012 from U.S. Appl. No. 12/607,843.
Notice of Allowance dated Apr. 28, 2011 from U.S. Appl. No. 29/356,631.
Notice of Allowance dated Nov. 12, 2010 from U.S. Appl. No. 29/356,633.
Notice of Allowance dated Nov. 12, 2010 from U.S. Appl. No. 29/356,634.
Notice of Allowance dated Nov. 12, 2010 from U.S. Appl. No. 29/356,635.
Notice of Allowance dated Nov. 28, 2011 from Canadian Application No. 2,710,269.
Office Action dated Jan. 12, 2012 from U.S. Appl. No. 12/364,369.
Office Action dated Jan. 25, 2012 from U.S. Appl. No. 12/568,087.
Office Action dated Feb. 1, 2011 from Canadian Application No. 2,691,707.
Office Action dated Feb. 9, 2012 from U.S. Appl. No. 12/364,339.
Office Action dated Feb. 28, 2012 from U.S. Appl. No. 12/539,497.
Office Action dated Mar. 2, 2012 from U.S. Appl. No. 12/639,041.
Office Action dated Mar. 13, 2012 from U.S. Appl. No. 12/364,359.
Office Action dated Mar. 20, 2012 from U.S. Appl. No. 12/764,164.
Office Action dated Mar. 29, 2012 from GB Application No. 1107052.1.
Office Action dated Apr. 10, 2012 from U.S. Appl. No. 12/854,370.
Office Action dated Apr. 12. 2012 from Canadian Application No. 2,691,707.
Office Action dated Apr. 13, 2012 from Australian Application No. 2008236526.
Office Action dated Apr. 17, 2012 from U.S. Appl. No. 12/607,843.
Office Action dated Apr. 25, 2012 from U.S. Appl. No. 12/363,046.
Office Action dated May 1, 2012 from Australian Application No. 2009300362.
Office Action dated May 15, 2012 from U.S. Appl. No. 12/797,243.
Office Action dated May 17, 2012 from U.S. Appl. No. 12/364,369.
Office Action dated May 24, 2011 from U.S. Appl. No. 12/363,951.
Office Action dated Jun. 1, 2012 from U.S. Appl. No. 12/855,977.
Office Action dated Jun. 4, 2012 from U.S. Appl. No. 12/568,08.
Office Action dated Jun. 4, 2012 from U.S. Appl. No. 12/703,958.
Office Action dated Jun. 8, 2012 from U.S. Appl. No. 12/639,041.
Office Action dated Jun. 13, 2012 from U.S. Appl. No. 12/639,373.
Office Action dated Jun. 18, 2012 from U.S. Appl. No. 12/701,468.
Office Action dated Jun. 18, 2012 from U.S. Appl. No. 12/701,496.
Office Action dated Jul. 2, 2012 from U.S. Appl. No. 12/797,262.
Office Action dated Jun. 26, 2012 from U.S. Appl. No. 12/639,041.
Office Action dated Jul. 27, 2012 from European Application No. 08743671.3.
Office Action dated Aug. 15, 2012 from Australian Application No. 2010214104.
Office Action dated Aug. 17, 2012 from Australian Application No. 2009300313.

(56) References Cited

OTHER PUBLICATIONS

Office Action dated Aug. 29, 2012 from U.S. Appl. No. 12/701,447.
Office Action dated Sep. 4, 2012 from U.S. Appl. No. 12/622,768.
Office Action dated Sep. 21, 2012 from U.S. Appl. No. 12/797,202.
Office Action dated Sep. 26, 2011 from Canadian Application No. 2,739,119.
Office Action dated Sep. 26, 2011 from Canadian Application No. 2,739,320.
Office Action dated Oct. 4, 2011 from U.S. Appl. No. 12/364,359.
Office Action dated Oct. 20, 2011 from U.S. Appl. No. 12/639,041.
Office Action dated Oct. 24, 2011 from U.S. Appl. No. 12/236,688.
Office Action dated Nov. 9, 2011 from U.S. Appl. No. 12/429,929.
Office Action dated Nov. 15, 2011 from Canadian Application No. 2,691,707.
Office Action dated Dec. 30, 2011 from U.S. Appl. No. 12/701,447.
Office Action dated Jul. 20, 2010 from U.S. Appl. No. 11/696,606.
Office Action dated Jul. 11, 2011 from Canadian Application No. 2713282.
Office Action dated Jun. 28, 2011 from Canadian Application No. 2710269.
Office Action dated Mar. 3, 2011 from Australian Application No. 2008226627.
Office Action dated Mar. 9, 2011 from Australian Application No. 2008236526.
Office Action dated Oct. 6, 2010 from Canadian Application No. 2623761.
Product Data, Hard Hat Aerosols Marking Paint 2300; Rust-oleum Netherlands B.V., Apr. 2005, 1 page, http://www.rustoleum.co.uk/downloads/2300%20Marking%20Spray.pdf.
Product Data, "Inverted Marking Chalk," Rust-oleum, Jul. 2004, 2 pages, http://www.policeone.com/pdfs/markingchalkinfo_ro.pdf.
Virginia Underground utility marking standard, Mar. 2004, 20 pages.
Notice of Allowance dated Jan. 25, 2012 from Canadian Application No. 2,710,189.
U.S. Appl. No. 13/686,262, filed Nov. 27, 2012, Nielsen et al.
Notice of Allowance dated Oct. 17, 2012 from U.S. Appl. No. 12/236,688.
Notice of Allowance dated Oct. 25, 2012 from U.S. Appl. No. 12/639,373.
Notice of Allowance dated Nov. 7, 2012 from U.S. Appl. No. 12/639,041.
Notice of Allowance dated Dec. 12, 2012 from U.S. Appl. No. 12/703,958.
Notice of Allowance dated Dec. 21, 2012 from U.S. Appl. No. 12/364,339.
Office Action dated Sep. 25, 2012 from Australian Application No. 2010214053.
Office Action dated Oct. 2, 2012 from Japanese Application No. 2010-502170.
Office Action dated Oct. 15, 2012 from U.S. Appl. No. 12/797,227.
Office Action dated Oct. 19, 2012 from U.S. Appl. No. 12/797,243.
Office Action dated Nov. 14, 2012 from Canadian Application No. 2,750,908.
Office Action dated Nov. 20, 2012 from U.S. Appl. No. 12/701,468.
Office Action dated Nov. 21, 2012 from U.S. Appl. No. 12/701,496.
Office Action dated Nov. 23, 2012 from U.S. Appl. No. 12/855,977.
Office Action dated Nov. 26, 2012 from U.S. Appl. No. 12/764,164.
Office Action dated Dec. 5, 2012 from U.S. Appl. No. 12/797,262.
Office Action dated Dec. 18, 2012 from U.S. Appl. No. 12/786,929.
Office Action dated Dec. 20, 2012 from U.S. Appl. No. 12/571,408.
Olsson, Office Action dated Sep. 13, 2012 from U.S. Appl. No. 12/827,993.
Office Action dated Apr. 24, 2013 from U.S. Appl. No. 12/432,909.
Corrected Notice of Allowability from U.S. Appl. No. 12/364,369 dated Apr. 15, 2013.
Corrected Notice of Allowability from U.S. Appl. No. 12/703,958 dated Apr. 18, 2013.
Corrected Notice of Allowability from U.S. Appl. No. 12/797,227 dated Apr. 17, 2013.
Notice of Alowance dated Apr. 25, 2013 from U.S. Appl. No. 12/364,359.
Office Action dated Mar. 13, 2013 from Chinese Application No. 201080045879.1.
Office Action dated Apr. 26, 2013 from U.S. Appl. No. 12/859,394.
U.S. Appl. No. 13/846,120, filed Mar. 18, 2013, Nielsen et al.
U.S. Appl. No. 13/834,382, filed Mar. 15, 2013, Nielsen et al.
U.S. Appl. No. 13/797,229, filed Mar. 12, 2013, Nielsen et al.
U.S. Appl. No. 13/795,337, filed Mar. 12, 2013, Nielsen et al.
U.S. Appl. No. 13/751,862, filed Jan. 28, 2013, Nielsen et al.
Corrected Notice of Allowability from U.S. Appl. No. 12/622,768 dated Apr. 3, 2013.
Corrected Notice of Allowability from U.S. Appl. No. 12/797,202 dated Apr. 4, 2013.
Notice of Allowance dated Jan. 8, 2013 from U.S. Appl. No. 12/797,243.
Notice of Allowance dated Jan. 22, 2013 from U.S. Appl. No. 12/703,958.
Notice of Allowance dated Feb. 1, 2013 from U.S. Appl. No. 12/797,202.
Notice of Allowance dated Feb. 13, 2013 from U.S. Appl. No. 12/701,447.
Notice of Allowance dated Feb. 20, 2013 from U.S. Appl. No. 12/364,369.
Notice of Allowance dated Mar. 28, 2013 from U.S. Appl. No. 12/797,227.
Notice of Allowance dated Mar. 12, 2013 from U.S. Appl. No. 12/429,929.
Notice of Allowance from U.S. Appl. No. 12/622,768 dated Jan. 24, 2013.
Office Action dated Feb. 26, 2013 from Canadian Application No. 2,738,968.
Office Action dated Mar. 20, 2013 from U.S. Appl. No. 12/764,164.
Office Action dated Mar. 25, 2013 from U.S. Appl. No. 12/797,211.
Office Action dated Mar. 28, 2013 from U.S. Appl. No. 12/571,408.
Office Action from Japanese Application No. 2009-553688.
Complaint for Patent Infringement dated Apr. 10, 2013, *CertusView Technologies LLC* v. *United States Infrastructure Corporation et al.*, Case No. 2:13CV182, USDC Eastern District of Virginia.
Complaint for Patent Infringement dated May 28, 2013, *CertusView Technologies LLC* v. *S&N Locating Services, LLC et al.*, Case No. 1:13CV646, USDC Eastern District of Virginia.
Corrected Notice of Allowability dated May 10, 2013 from U.S. Appl. No. 12/797,227.
Corrected Notice of Allowability dated May 13, 2013 from U.S. Appl. No. 12/429,929.
Corrected Notice of Allowability dated May 14, 2013 from U.S. Appl. No. 12/797,202.
Corrected Notice of Allowability dated Jun. 4, 2013 from U.S. Appl. No. 12/797,243.
Decision of Final Rejection dated Apr. 24, 2013 from Japanese Application No. 2010-502170.
Notice of Allowance dated May 10, 2013 from U.S. Appl. No. 12/797,243.
Notice of Allowance dated Jun. 17, 2013 from Canadian Application No. 2,750,908.
Office Action dated May 10, 2013 from U.S. Appl. No. 12/786,929.
Office Action dated Jun. 17, 2013 from U.S. Appl. No. 12/797,262.
U.S. Appl. No. 13/867,521, filed Apr. 22, 2013, Nielsen et al.
Office Action dated Dec. 28, 2012 from U.S. Appl. No. 12/364,359.
Notice of Allowability dated Jul. 5, 2013 from U.S. Appl. No. 12/701,447.
Office Action dated Aug. 7, 2013 from Canadian Application No. 2,739,119.
Office Action dated Aug. 7, 2013 from Canadian Application No. 2,739,320.
Notice of Allowability dated Jul. 10, 2013 from U.S. Appl. No. 13/795,337.

\* cited by examiner

MARKING DEVICE DOCKING STATIONS AND METHODS OF USING SAME

CROSS-REFERENCE TO RELATED APPLICATION

This application claims priority based on Provisional Application Ser. No. 61/102,115, filed Oct. 2, 2008, which is hereby incorporated by reference in its entirety.

FIELD OF THE INVENTION

The present invention relates generally to the field of marking devices and, more particularly, to docking stations for use with marking devices and to methods of using the same.

BACKGROUND

Field technicians, such as land surveyors and utility location experts, often utilize marking material to identify a specific location on the ground. Conventional marking devices are used for dispensing a marking material, such as marking spray paint.

Existing marking devices are relatively inexpensive. Accordingly, the cost of individual marking devices is generally considered insignificant by the user of the marking device. Consequently, users may not take due care when handling such marking devices. As a result, marking devices are often mishandled, broken, or left behind in the field. As marking devices become more complex and incorporate additional functions, the devices become more costly. Therefore, approaches are needed in the marking industry to provide better ways of handling and keeping track of marking devices in the field. Similarly, as increased functionality is incorporated into marking devices, it is desirable to provide methods of managing data and power requirements of the marking devices in the field.

Further, users may carelessly stow marking devices in their vehicles. For example, users often toss marking devices into vehicles and leave them unsecured. In the event of a vehicle accident, the marking device may be thrown about the vehicle cab and cause injury to the passengers. Consequently, it is desirable to provide better methods of securing marking devices in vehicles.

Accordingly, approaches are needed for better ways of handling and tracking marking devices, securing marking devices in vehicles, and managing data and power requirements of marking devices.

SUMMARY OF THE INVENTION

The present invention relates generally to the field of marking devices used for marking the presence or absence of an underground facility in a dig area. More particularly, the invention relates to docking stations for use with such marking devices and to methods for using the docking station with a marking device. The docking station may serve as a home base for storage of a marking device, for charging the battery of a marking device, for facilitating data transfer to and from a marking device, and for securing a marking device against unauthorized use and/or theft. In some embodiments, the docking station may be a mobile docking station that is installed in a vehicle. In other embodiments, the docking station may be a fixed docking station that is installed in a central location in the field, at a central office, at a home base facility, and the like.

According to a first aspect of the invention, a docking station is provided for docking a marking device of the type used to mark the presence or absence of an underground facility in a dig area. The docking station comprises a housing, an electronic interface to transfer information to and from the marking device, and docking control electronics to control operation of the docking station.

According to a second aspect of the invention, a method is provided for handling a marking device of the type used to mark the presence or absence of an underground facility in a dig area. The method comprises electronically coupling a marking device to a docking station and transferring information to and between the marking device and the docking station.

According to a third aspect of the invention, a system is provided for use with marking devices of the type used to mark the presence or absence of an underground facility in a dig area. The system comprises at least one docking station configured to communicate electronically with a marking device; and a computing device configured to communicate electronically with the docking station and configured to receive and record marking device data via the docking station and to transmit information to the docking station.

According to a fourth aspect of the invention, a system is provided for operation of marking devices of the type used to mark the presence or absence of an underground facility in a dig area. The system comprises a first docking station configured to communicate electronically with a first marking device; and a second docking station configured to communicate electronically with a second marking device, the first and second docking stations being configured to communicate directly with each other.

According to a fifth aspect of the invention, a system is provided for operation of a marking device of the type used to mark the presence or absence of an underground facility in a dig area. The system comprises at least one docking station configured to communicate electronically with a marking device; and a marking device configured to mark the presence or absence of an underground facility in a dig area and to communicate electronically with the docking station.

According to a sixth aspect of the invention, a system is provided for operation of marking devices of the type used to mark the presence or absence of an underground facility in a dig area. The system comprises a plurality of docking stations mounted in fixed locations for storage of respective marking devices; and a computing device configured to communicate electronically with the docking stations and to monitor and control the operational status of marking devices docked in the docking stations.

BRIEF DESCRIPTION OF THE DRAWINGS

The objects and features of the present invention are set forth with particularity in the appended claims. The present invention, both as to its organization and manner of operation, together with further objectives and advantages, may be best understood by reference to the following description, taken in connection with the accompanying drawings as set forth below:

DETAILED DESCRIPTION

Figure 1:
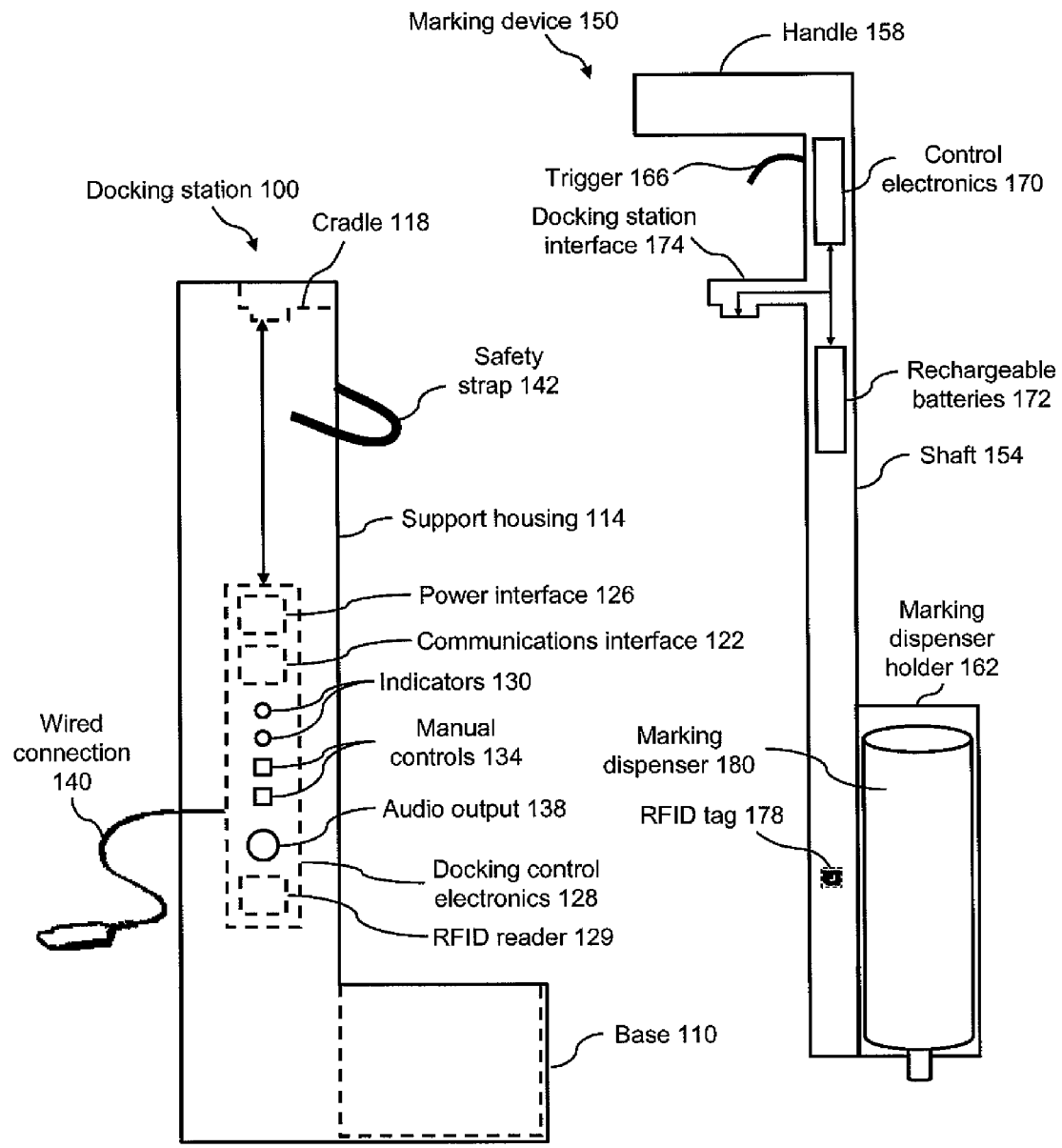
FIG. 1 is a schematic design of a docking station and a marking device, with the marking device removed from the docking station, according to embodiments of the invention; docking station.

The present invention relates to marking devices used for marking the presence or absence of an underground facility in a dig area and, more particularly, to docking stations for use with such marking devices. The present invention further includes methods for using docking stations with marking devices. By way of example, the docking station may serve as a home base for storage of a marking device and for charging the battery of a marking device. In some embodiments, the docking station may be a mobile docking station that is installed in a vehicle. In other embodiments, the docking station may be a fixed docking station that is installed at a central location in the field, at a central office, at a home base facility, and the like. The docking station may be used in a variety of locations that are convenient and/or accessible for a user, including worksites, and may be fixed or mobile depending on the configuration.

For purposes of the present disclosure, the term "dig area" refers to a specified area of a work site within in which there is a plan to disturb the ground (e.g., excavate, dig holes and/or trenches, bore, etc.), and beyond which there is no plan to excavate in the immediate surroundings. Thus, the metes and bounds of a dig area are intended to provide specificity as to where some disturbance to the ground is planned at a given work site. It should be appreciated that a given work site may include multiple dig areas.

The term "facility" refers to one or more lines, cables, fibers, conduits, transmitters, receivers, or other physical objects or structures capable of or used for carrying, transmitting, receiving, storing, and providing utilities, energy, data, substances, and/or services, and/or any combination thereof. The term "underground facility" means any facility beneath the surface of the ground. Examples of facilities include, but are not limited to, oil, gas, water, sewer, power, telephone, data transmission, cable television (TV), and/or internet services.

The term "locate device" refers to any apparatus and/or device for detecting and/or inferring the presence or absence of any facility, including without limitation, any underground facility. In various examples, a locate device may include both a locate transmitter and a locate receiver (which in some instances may also be referred to collectively as a "locate instrument set," or simply "locate set").

The term "marking device" refers to any apparatus, mechanism, or other device that employs a marking dispenser for causing a marking material and/or marking object to be dispensed, or any apparatus, mechanism, or other device for electronically indicating (e.g., logging in memory) a location, such as a location of an underground facility. Additionally, the term "marking dispenser" refers to any apparatus, mechanism, or other device for dispensing and/or otherwise using, separately or in combination, a marking material and/or a marking object. An example of a marking dispenser may include, but is not limited to, a pressurized can of marking paint. The term "marking material" means any material, substance, compound, and/or element, used or which may be used separately or in combination to mark, signify, and/or indicate. Examples of marking materials may include, but are not limited to, paint, chalk, dye, and/or iron. The term "marking object" means any object and/or objects used or which may be used separately or in combination to mark, signify, and/or indicate. Examples of marking objects may include, but are not limited to, a flag, a dart, and arrow, and/or an RFID marking ball. It is contemplated that marking material may include marking objects. It is further contemplated that the terms "marking materials" or "marking objects" may be used interchangeably in accordance with the present disclosure.

The term "locate mark" means any mark, sign, and/or object employed to indicate the presence or absence of any underground facility. Examples of locate marks may include, but are not limited to, marks made with marking materials, marking objects, global positioning or other information, and/or any other means. Locate marks may be represented in any form including, without limitation, physical, visible, electronic, and/or any combination thereof.

The terms "actuate" or "trigger" (verb form) are used interchangeably to refer to starting or causing any device, program, system, and/or any combination thereof to work, operate, and/or function in response to some type of signal or stimulus. Examples of actuation signals or stimuli may include, but are not limited to, any local or remote, physical, audible, inaudible, visual, non-visual, electronic, mechanical, electromechanical, biomechanical, biosensing or other signal, instruction, or event. The terms "actuator" or "trigger" (noun form) are used interchangeably to refer to any method or device used to generate one or more signals or stimuli to cause or causing actuation. Examples of an actuator/trigger may include, but are not limited to, any form or combination of a lever, switch, program, processor, screen, microphone for capturing audible commands, and/or other device or method. An actuator/trigger may also include, but is not limited to, a device, software, or program that responds to any movement and/or condition of a user, such as, but not limited to, eye movement, brain activity, heart rate, other data, and/or the like, and generates one or more signals or stimuli in response thereto. In the case of a marking device or other marking mechanism (e.g., to physically or electronically mark a facility or other feature), actuation may cause marking material to be dispensed, as well as various data relating to the marking operation (e.g., geographic location, time stamps, characteristics of material dispensed, etc.) to be logged in an electronic file stored in memory. In the case of a locate device or other locate mechanism (e.g., to physically locate a facility or other feature), actuation may cause a detected signal strength, signal frequency, depth, or other information relating to the locate operation to be logged in an electronic file stored in memory.

The terms "locate and marking operation," "locate operation," and "locate" generally are used interchangeably and refer to any activity to detect, infer, and/or mark the presence or absence of an underground facility. In some contexts, the term "locate operation" is used to more specifically refer to detection of one or more underground facilities, and the term "marking operation" is used to more specifically refer to using a marking material and/or one or more marking objects to mark a presence or an absence of one or more underground facilities. The term "locate technician" refers to an individual performing a locate operation. A locate and marking operation often is specified in connection with a dig area, at least a portion of which may be excavated or otherwise disturbed during excavation activities.

The term "user" refers to an individual utilizing a locate device and/or a marking device and may include, but is not limited to, land surveyors, locate technicians, and support personnel.

The term "power source" refers to an apparatus, a device, a system, and/or any other means, and/or any combination thereof that generates, transmits, converts, and/or supplies power or energy, including, but not limited to, electrical power.

Reference is now made to the following description of embodiments of the present invention, which are illustrated in the accompanying figures. The same reference numbers in different drawings may identify the same or similar elements. In addition, the following detailed description does not limit the present invention.

A docking station 100 and a marking device 150, removed from docking station 100, are shown in the schematic diagram of FIG. 1. Docking station 100 may be installed in, for example, a vehicle and is suitable for use in conjunction with marking device 150. In other embodiments, the docking station 100 may be installed at a central facility, office or other fixed location. Thus, the docking station 100 may be mobile or fixed. Docking station 100 may serve as a home base for storage of marking device 150 and for charging the battery of marking device 150.

Docking station 100 may include a base 110 and a support housing 114. Base 110 and support housing 114 may be made of any suitably strong, rigid, and lightweight material. Such material may include, but is not limited to, molded plastic and metal. Docking station 100 may be designed and constructed to be bolted to the body of a vehicle and may be made of materials that prevent unauthorized removal from a vehicle. In the embodiment of FIG. 1, docking station 100 is configured and mounted to support marking device 150 in an upright, or vertical, position. In other embodiments, docking station may be configured and mounted to support marking device 150 in a horizontal position or in any other position.

In an embodiment, a cradle 118 is integrated into the upper end of support housing 114. This provides a mechanism to mechanically and electrically couple marking device 150 to docking station 100. Other embodiments illustrating a cradle that may be integrated into support housing 114 are described with reference to FIGS. 5A, 5B, 6A, 6B, and 7.

Electronic and electro-mechanical components that provide an interface between a marking device, an external computing device, and/or a power source may be installed in support housing 114. For example, docking control electronics 128, including a communications interface 122 and a power interface 126, may be installed in support housing 114. Communications interface 122 and power interface 126 may be the drive and buffer circuitry for supplying electrical signals and power, respectively, to cradle 118, which in turn supplies electrical signals and power to marking device 150 when marking device 150 is attached to docking station 100. In the embodiment of FIG. 1, communications interface 122 provides a wired connection to control electronics in marking device 150. In other embodiments, docking station 100 may include a wireless link to control electronics in marking device 150. Docking station 100 may supply electrical signals and power to any configuration or embodiment of marking device 150, and marking device 150 may receive electrical signals and power from any configuration or embodiment of docking station 100.

Docking control electronics 128 may include a processor and other circuitry for managing and driving various user interface devices, such as, but not limited to, indicators 130, manual controls 134, and audio output 138. Docking station 100 may include visible and/or audible means of informing the user of status changes and other conditions requiring attention. Further, docking station 100 may include user controls that allow a user to initiate activities, such as data synchronization (e.g., uploading and downloading data). For example, indicators 130 may include one or more light-emitting diode (LED) devices of specified colors and indicate a meaning to the user (e.g., red, green, and yellow battery status indicators; yellow and orange data synchronization status indicators, and the like). Manual controls 134 may include one or more manual push buttons for initiating various functions (e.g., an initiate data synchronization push button). Audio output 138 may be, for example, an audio speaker, an audio alarm and/or buzzer. Docking control electronics 128 may include an audio input (not shown). For example, an audio input, such as a microphone, may be incorporated into the docking station.

Docking control electronics 128 may also include a mechanism for short range identification, such as radio-frequency identification (RFID). For example, docking station 100 may include an RFID reader 129 for reading an RFID tag affixed to marking device 150. In another embodiment, docking station 100 may include a barcode reader for reading a barcode affixed to marking device 150.

The processor of docking control electronics 128 may be capable of managing data transfer between marking device 150 and an external computing device. For example, a wired connection 140, such as a universal serial bus (USB) connection, RS232 connectors, RJ45 connectors, Ethernet, and any combination thereof may be provided between docking control electronics 128 of docking station 100 and an external computing device. Further, the processor of docking control electronics 128 may be programmable to perform any user-defined function, such as, but not limited to, executing a security function programmed to ensure that only authorized personnel may access and use marking device 150 and/or docking station 100. Additionally, a wired power connection (not shown) may be provided for connecting docking station 100 to the power source of a vehicle in which it is installed. The power source of a vehicle may be used to charge the battery of marking device 150.

Additionally, a safety strap 142 for securing marking device 150 in docking station 100 may be attached to support housing 114 of docking station 100. In one embodiment, a device, incorporated in safety strap 142, is capable of conducting an electrical signal that may be detected by docking control electronics 128 to indicate whether safety strap 142 has been secured around marking device 150. For example, a small tracer wire may be installed within safety strap 142, which changes a logic state depending upon whether both ends or one end only is fastened to support housing 114. As described below, docking station 100 may include additional or different locking and security devices.

Marking device 150 may be any marking device that has, for example, battery powered electronics incorporated therein for any functionality (e.g., global positioning system (GPS) technology, RFID technology, data storage devices, electronic actuator, electronic display, marking material sensing technology, wired and/or wireless communications technology and the like). For example, marking device 150 may be a marking device as described in U.S. publication no. 2008-0228294-A1, published Sep. 18, 2008, filed Mar. 13, 2007, and entitled "Marking System and Method With Location and/or Time Tracking;" U.S. publication no. 2008-0245299-A1, published Oct. 9, 2008, filed Apr. 4, 2007, and entitled "Marking System and Method;" and U.S. publication no. 2009-0204238-A1, published Aug. 13, 2009, filed Feb. 2, 2009, and entitled "Electronically Controlled Marking Apparatus and Methods;" which are incorporated by reference herein in their entirety.

It will be understood that the docking stations described herein can be used with other marking devices, including but not limited to marking devices that have limited electronic capability and marking devices that have no electronic capability. In some embodiments, the docking station may be used for holding, storage and/or locking of the marking device, without electronic functionality. In addition, the docking station may be used for docking of a combination locate and marking device, which includes both locate and marking functions.

Marking device 150 may include a shaft 154, a handle 158, a marking dispenser holder 162, an actuator 166, control electronics 170, at least one rechargeable battery 172 for powering control electronics 170, a docking station interface 174, and an RFID tag 178. Rechargeable battery 172 may be a power source for the marking device 150. Rechargeable batteries 172 may be, for example, rechargeable lithium ion batteries, which are sized according to the requirements of control electronics 170. RFID tag 178 may store a unique identification code, which may be used to identify and track marking device 150.

A marking dispenser 180 (e.g., an aerosol marking paint canister) may be installed in marking dispenser holder 162 of marking device 150 as illustrated. Actuator 166 may be an electrical/mechanical actuator for activating the marking material spray action of marking dispenser 180.

Control electronics 170 may include, but is not limited to, a processor, GPS technology, RFID technology, data storage devices, electronic actuator, electronic display, marking material sensing technology and wired and/or wireless communications technology (e.g., an Intranet connection, Internet, Bluetooth® technology, Wi-Fi, Wi-Max, IEEE 802.11 technology, radio frequency (RF), Infrared Data Association (IrDA) compatible protocols, Local Area Networks (LAN), Wide Area Networks (WAN), Shared Wireless Access Protocol (SWAP), combinations thereof, and other types of wireless networking protocols).

Docking station interface 174 is a mechanism that is designed to fit cradle 118 of docking station 100 to provide a mechanical and electrical connection therebetween. The physical dimensions and shape of docking station interface 174 of marking device 150 substantially correspond to the physical dimensions and shape of cradle 118 of docking station 100. Furthermore, electrical inputs/outputs (I/Os) (e.g., signal, data, and power), integrated into docking station interface 174, are designed to connect to their counterparts integrated in cradle 118 of docking station 100. An example of docking station interface 174 of marking device 150 is described with reference to FIGS. 5A, 5B, 6A, 6B, and 7.

Figure 2:
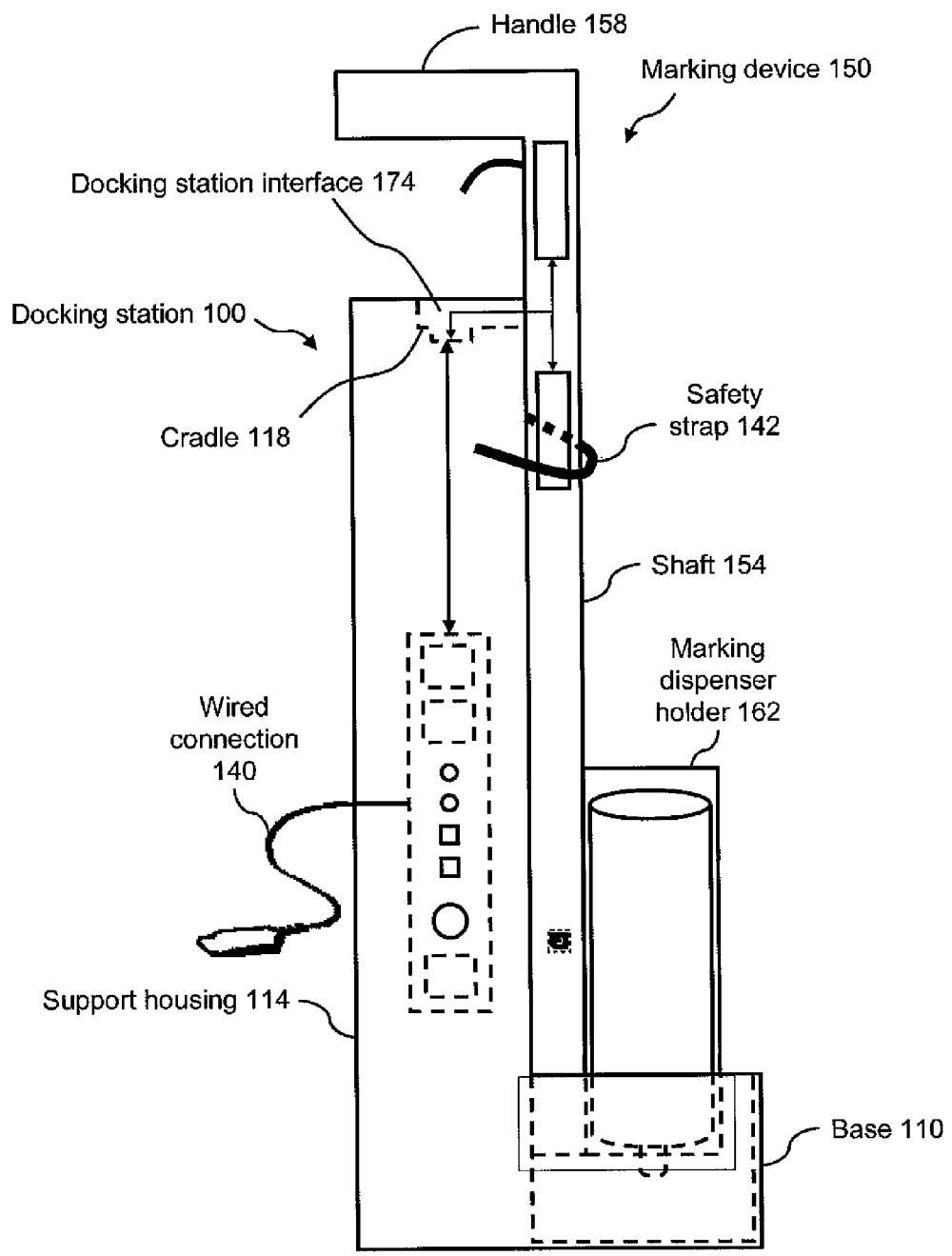
FIG. 2 is a schematic diagram of a marking device attached to a FIG. 3A is a simplified block diagram of a system that includes an electronic docking station coupled to a marking device, in accordance with embodiments of the invention.

FIG. 2 is a schematic diagram of marking device 150 attached to docking station 100, according to embodiments of the invention. More specifically, FIG. 2 depicts marking device 150 resting and retained within a cavity of base 110 of docking station 100. Docking station interface 174 of marking device 150 is engaged with cradle 118 of docking station 100. Docking station 100 can be configured to dock marking device 150 either with or without marking dispenser 180 installed in marking device 150. Safety strap 142 may be fastened around shaft 154 of marking device 150 to hold marking device 150 securely, so that the marking device remains mechanically and electrically coupled to docking station 100.

The docking station 100 shown in FIGS. 1 and 2 and described above provides both mechanical and electronic docking of a marking device. In particular, the docking station 100 is mechanically coupled to the marking device 150 in the docked position and has docking station electronics 128 which communicate electronically with control electronics 170 in marking device 150. It will be understood, however, that the docking station may have a variety of configurations within the scope of the present invention.

Figure 3A:
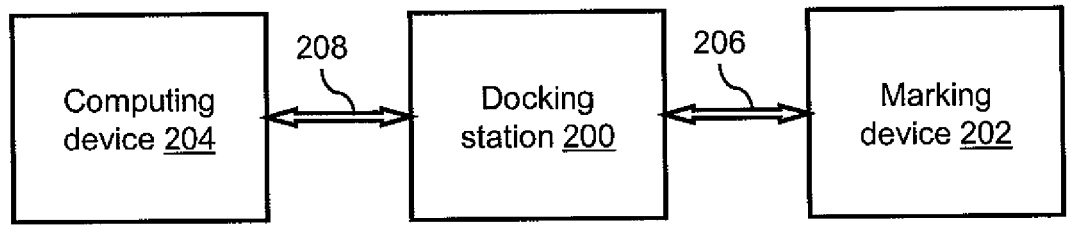
FIG. 3B is a simplified block diagram of a system that includes an electronic and mechanical docking station coupled to a marking device, in accordance with embodiments of the invention.
FIG. 3C is a simplified block diagram of a system that includes a mechanical docking station coupled to a marking device, in accordance with embodiments of the invention.

Referring to FIG. 3A, a block diagram of an electronic docking station 200 is shown. Docking station 200 includes docking control electronics coupled by an electronic connection 206 to a marking device 202. Electronic connection 206 may be a wired connection, such as by a cable or electrical connector, or may be a wireless connection. Embodiments of docking control electronics for docking station 200 are described below. Docking station 200 may be connected to a computing device 204 via an electronic connection 208, which may be a wired connection or a wireless connection. The computing device 204 may be an on-site computer, such as an in-vehicle computer, or may be a remote computer, such as a central office computer. Docking station 200 provides electronic support of marking device 202 and supports such functions as data storage and/or transfer, battery charging and diagnostics and calibration, for example. However, docking station 200 is not mechanically coupled to marking device 202 and does not provide mechanical support, storage or locking of marking device 202. The physical configuration of docking station 200 may be an electronics enclosure or housing having suitable connectors, cables and/or antennas for communication with marking device 202 and computing device 204, and optional user interface components as described below.

Figure 3B:
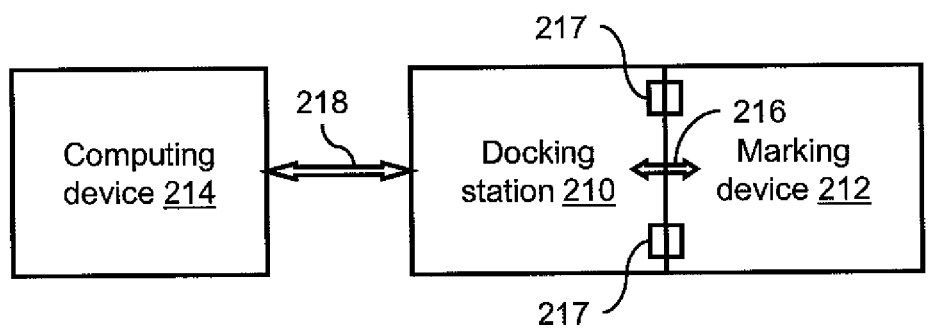

Referring to FIG. 3B, a docking station 210 is mechanically and electronically coupled to a marking device 212. An electronic connection 216 between docking station 210 and marking device 212 may be a wired connection, such as by a cable or electrical connector, or may be a wireless connection between docking station electronics and marking device electronics. Docking station 210 further includes a mechanical connection 217 to marking device 212. Mechanical connection 217 may have a variety of configurations, including, but not limited to, a holder to support and retain marking device 212, a locking mechanism that is mechanically or electronically controlled and/or a partial or complete enclosure for marking device 212. The partial or complete enclosure for the marking device may provide security for the marking device and/or may protect the marking device against exposure to weather conditions. The docking station 210 may provide mechanical support for marking device 212 in any desired position, such as vertical or horizontal, for example, and may be fixed or mobile. Docking station 210 may include an electronic connection 218 to a computing device 214, which may be local or remote as described above in connection with computing device 204. Electronic connection 218 may be a wired connection or a wireless connection. The docking station 100 shown in FIGS. 1 and 2 may be of the type shown in FIG. 3B.

Figure 3C:
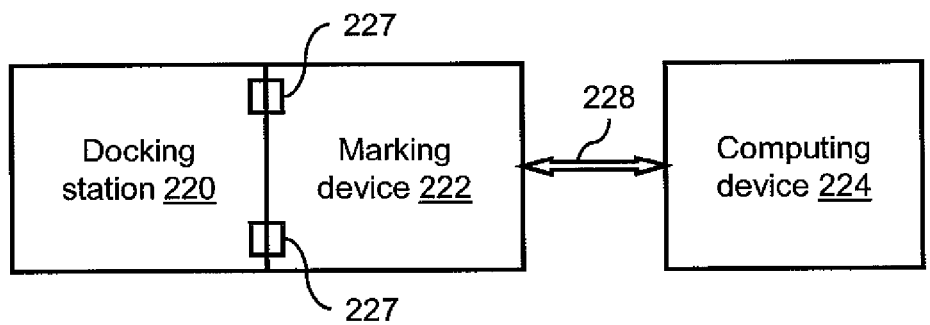

Referring to FIG. 3C, a docking station 220 is mechanically coupled to a marking device 222 by a mechanical connection 227. The mechanical connection between docking station 220 and marking device 222 may have any desired mechanical configuration, including but not limited to a holder to support and retain marking device 222 in a desired orientation, such as vertical or horizontal, a locking mechanism to secure marking device 222 to docking station 220 and/or a partial or complete enclosure for marking device 222. The partial or complete enclosure for the marking device may provide security for the marking device and/or may protect the marking device against exposure to weather conditions. In the embodiment of FIG. 3C, an electronic connection is not provided between docking station 220 and marking device 222. Marking device 222 may communicate directly with a computing device 224 via an electronic connection 228, which may be a wired connection or a wireless connection. Computing device 224 may be a local computer, such as an in-vehicle computer or may be a remote computer, such as a central office computer. The physical configuration of docking station 220 may be similar to docking station 100 shown in FIGS. 1 and 2, with most or all electronic components omitted.

In each of FIGS. 3A, 3B and 3C, the electronic connection to the computing device is optional. The computing device may provide control of the docking station and may receive marking device data, such as data from electronic records of marking operations. The marking device data may be transferred by the docking station from the marking device directly to the computing device and/or may be stored in a local memory of the docking station. The data transfer may occur at the time of docking of the marking device or may occur at a later time, such as at the end of the day. In other embodiments, the electronic connection between the docking station and the computing device is omitted. For example, data can be transferred from the docking station to any desired computing device by use of a removable memory.

In the embodiments of FIGS. 3A, 3B and 3C, the docking station may provide a battery charging function for the marking device. Thus, for example, the docking station can be connected to a power source, such as an AC power source for fixed applications, or a DC source, such as vehicle power, for mobile applications. The docking station may include circuitry for charging batteries in the marking device. In other embodiments, a separate battery charger is connected directly to the marking device.

Figure 4:
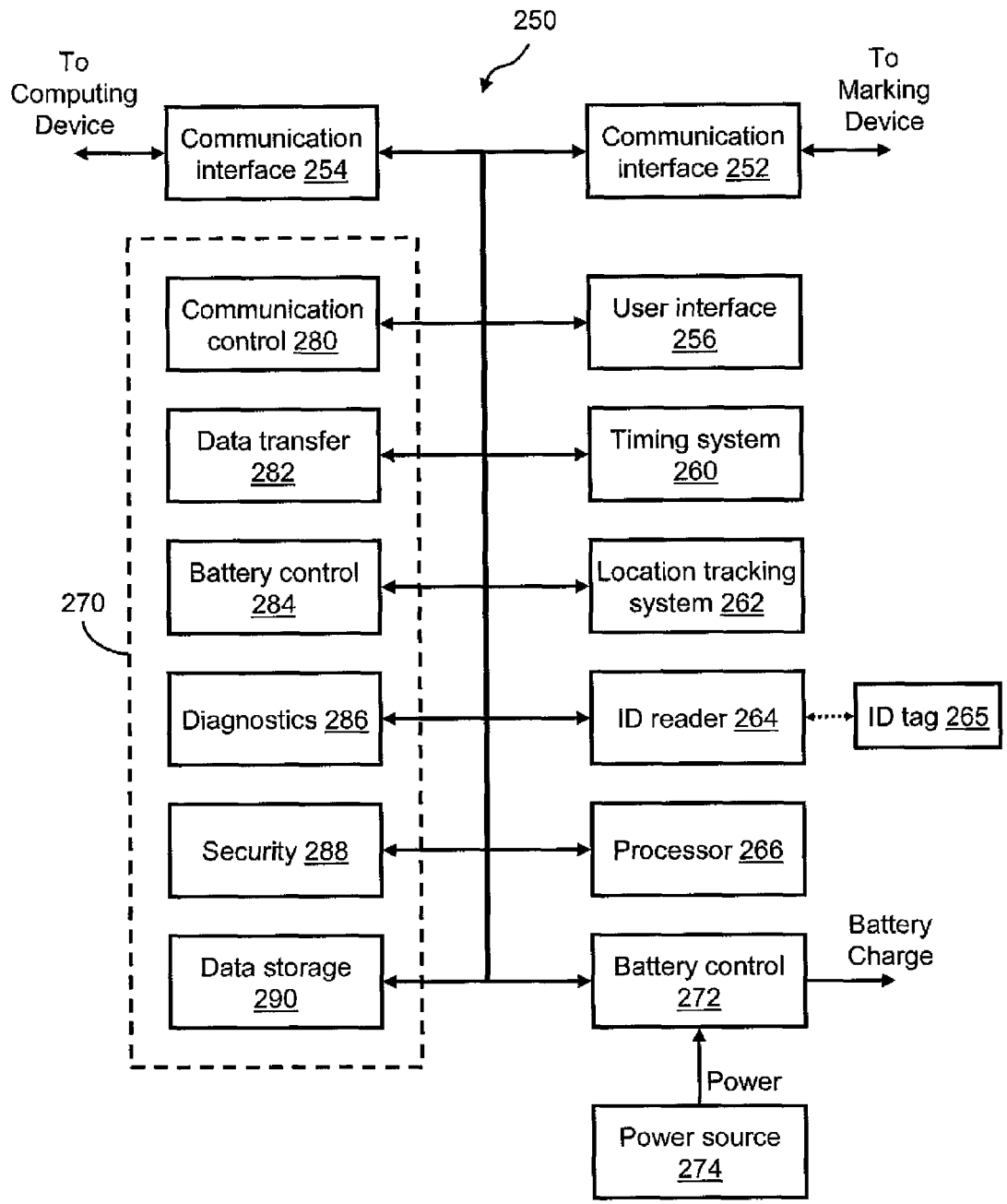
FIG. 4 is a schematic block diagram of docking station electronics, in accordance with embodiments of the invention.

A block diagram of docking control electronics 250 in accordance with embodiments of the invention is shown in FIG. 4. Docking control electronics 250 may include components for managing the overall operation of the docking stations described herein. Docking control electronics 250 may include a communication interface 252 for communication with a marking device, a communication interface 254 for communication with a local or remote computing device, and a user interface 256 for interacting with a user by receiving user inputs and/or providing information to a user. Docking control electronics 250 may further include a timing system 260 for timing of docking station operations and events, a location tracking system 262 for determining geographical coordinates of the docking station and an ID reader 264 for reading an identification tag 265 on the marking device.

Docking control electronics 250 may further include a processor 266 and at least one memory 270. Memory 270 may be used for storage of control software and for data storage. It will be understood that memory 270 may be configured as one or more memories, such as separate memories for data storage and program storage. Memory 270 may include a data storage area 290 for storage of data transferred from the marking device and/or other data involved in operation of the docking station.

Docking control electronics 250 may further include a battery control circuit 272 which receives AC or DC power from an external power source 274 and performs charging of the battery of the marking device under control of processor 266.

In some embodiments, docking control electronics 250 may include a memory connector (not shown) to permit connection of a memory device, such as a memory device containing data from the marking device. In further embodiments, docking control electronics 250 may include a battery connector (not shown) to permit connection of one or more batteries from the marking device, for charging.

Control software, typically stored in memory 270, may include a communication control module 280 to control communication with the marking device and with the computing device, and a data transfer module 282 to perform data transfer to and between the marking device, a local memory and the computing device. The control software may further include a battery control module 284 to control battery charging and recording of battery information, a diagnostics module 286 to perform diagnostics and calibration of the marking device, as well as diagnostics of the docking station itself. The control software may further include a security module 288 that controls a locking mechanism and/or data transfer operations based on information including, but not limited to, a table of approved marking device IDs, allowed and prohibited geographical coordinates and/or allowed and prohibited times and dates.

Communication interface 252 may be any wired and/or wireless communication interface by which information may be exchanged between the docking station and a marking device. Similarly, communication interface 254 may be any wired and/or wireless communication interface by which information may be exchanged between the docking station and a local or remote computing device. Examples of wired communication interfaces may include, but are not limited to, USB ports, RS232 connectors, RJ45 connectors, Ethernet, and combinations thereof. Examples of wireless communication interfaces may include, but are not limited to, Bluetooth® Technology, Wi-Fi, Wi-Max, IEEE 802.11 Technology, Radio Frequency (RF), Local Area Networks (LAN) and Wide Area Networks (WAN), Internet, Shared Wireless Access Protocol (SWAP), Infrared Data Association (IrDS) compatible protocols and other types of wireless networking protocols, and combinations thereof.

User interface 256 may be any mechanism or combination of mechanisms by which the user may interact with the docking station. For example, user interface 256 may include, but is not limited to, a display (including integrated displays and external displays, such as Heads-Up Displays (HUDs)), a touch screen, one or more manual pushbuttons, one or more toggle switches, a keypad, and combinations thereof. In one example, the display includes one or more liquid crystal displays (LCD) or light-emitting diode (LED) displays that are suitably small for use in a portable device yet suitably large for ease of viewing. User interface 256 may include standard zoom in and out controls for the display. In one example, a display includes a 4.3 inch diagonal LCD. Preferably, the display is at least 5 characters tall by 40 characters wide, is full-sun daylight readable and includes automatic backlighting for low light applications. In one implementation, the user interface 256 includes a "menu/on" button to power up the docking station and provide a menu-driven graphical user interface (GUI) displayed by the display device (e.g., menu items and/or icons displayed on the display device) and navigated by the technician via a joystick or a set of four "up/down/left/right" buttons, as well as a "select/ok" button to take some action pursuant to the selection of a menu item/icon. In further implementations, the user interface may include a microphone and the processor may be configured to accept and process audible commands, such that docking station operations may be accomplished via voice-activated commands by simply speaking into the microphone.

Additionally, user interface 256 may include one or more indicators such as, for example, LED indicators, audio devices, such as a speaker, a buzzer and/or an alarm, and combinations thereof. During normal usage of the docking station, the components of user interface 256 may be used to display, for example, the current status of the docking station, the current status of the docked marking device, alerts and notifications and option selections.

Timing system 260 may include an internal clock, such as a crystal oscillator device, for processor 266. Additionally, timing system 260 may include a mechanism for registering time with a specified degree of accuracy, such as accuracy to the minute, second or millisecond. Timing system 260 may also include a mechanism for registering the calendar date. Using timing system 260, a timestamp may be appended to any information that is handled by the docking station, such as for example marking device data, time of docking the marking device, time of undocking the marking device, time of battery charging, and the like. In some embodiments, timing system 260 may register the time and date using its internal clock. In other embodiments, timing system 260 may receive time and date information from location tracking system 262. In further embodiments, timing system 260 may receive time and date information from an external timing system, such as a remote computer or network, via communication interface 254.

Location tracking system 262 may include any device that can determine geographical coordinates to a specified degree of accuracy. For example, location tracking system 262 may include a Global Positioning System (GPS) receiver or a Global Navigation Satellite System (GNSS) receiver. A GPS receiver may provide, for example, any standard format data stream, such as a National Marine Electronics Association (NMEA) data stream. The location tracking system 262 may include an error correction component which may be a mechanism for improving the accuracy of the geographical coordinates provided by the location tracking system 262. In one example, the error correction component may include an algorithm for correcting offsets, such as due to local disturbances in the atmosphere, in the geographical coordinates provided by location tracking system 262. Using location tracking system 262, geographical coordinates can be recorded and/or transmitted for any docking station operation or information.

In another embodiment, location tracking system 262 may include a device or mechanism that determines location such as by performing triangulation by the use of cellular telephone towers.

ID reader 264 includes a mechanism for short range identification of the ID tag 265 which may be affixed to the marking device. ID reader 264 may be a radio frequency identification (RFID) reader for reading an RFID tag affixed to the marking device. In another embodiment, ID reader 264 may include a barcode reader for reading a barcode tag affixed to the marking device. The ID reader 264 typically reads the ID tag 265 when the marking device is docked in the docking station.

Processor 266 may be any general purpose processor, controller or microcontroller device that is capable of managing the overall operations of the docking station as described herein. The processor 266 may include a single processing device or more than one processing device.

Memory 270 may comprise any computer-readable media and may store computer instructions for implementing the various functions described herein as well as any data associated with operation of the docking station. The processor 266 may be used to execute the stored instructions. Memory 270 may include volatile and/or non-volatile data storage media and/or data storage devices. For example, memory 270 may be, but is not limited to, a random access memory (RAM), a read-only memory (ROM) and/or a removable memory device, such as a USB flash memory.

As indicated above, communication control module 280 includes software for controlling communication interface 252 to communicate with the marking device and for controlling communication interface 254 to communicate with a local or remote computing device. The communication may be associated with any function of the docking station, including but not limited to data transfer, control of the marking device, battery charging, diagnostics and calibration, for example. As indicated above, the communication with the marking device may be by wired connection or may be wireless. Further, the communication with the computing device may be by wired connection or may be wireless.

Data transfer module 282 controls data transfer to and between the marking device, the docking station and the local or remote computing device. Marking device data may be transferred from the marking device to data storage 290 in memory 270 for later transfer to the computer device. In other embodiments, data transfer module 282 is configured to control data transfer between the marking device and the computing device without temporary storage in data storage 290. In further embodiments, data transfer module 282 is configured to control data transfer from the docking station to the marking device. The data may be transferred to the marking device from data storage 290 and/or from the computing device. By way of example only, the data transferred to the marking device may define some or all parameters of a marking operation to be performed by the marking device.

In some embodiments, data transfer module 282 may be configured to provide data backup for the marking device. By copying marking device data to the local memory in the docking station and/or to the local or remote computing device at specified times, data integrity and data security are provided, even if the marking device is damaged, lost or stolen. For example, data can be copied from the marking device to the docking station upon completion of a marking operation or a part thereof, or at specified intervals.

Data transfer module 282 may ensure synchronization of data between the marking device and data storage 290 as described below. Data transfer module 282 may perform functions such as format conversion, data compression and the like, related to data communication. In some embodiments, data storage 290 may be a removable memory component, such as a USB flash memory, that is physically removed from the docking station and installed in the local or remote computing device for data transfer.

Battery control module 284 may control monitoring and charging of one or more batteries in the marking device by battery control circuit 272. The battery control module 284 may determine the charge state of the one or more batteries in the marking device and, if necessary, initiate and control battery charging. The battery control module, in conjunction with timing system 260, may be configured to record a date and time of battery charging. The battery control module 284, in conjunction with location tracking system 262, may be configured to record geographical coordinates of the battery charging operation. The battery control module 284 may be configured to determine and/or record various parameters of the one or more batteries in the marking device, including but not limited to battery quality and/or battery capacity.

Diagnostics module 286 may be configured to perform diagnostics of the marking device. In particular, diagnostics module 286 may place the marking device in a diagnostics mode and may execute a diagnostics routine on the marking device. The diagnostics routine may include sending stimulus signals to the marking device and receiving responses or lack thereof which indicate the operational state of the marking device. The diagnostics routine may test some or all of the components of the marking device.

Diagnostics module 286 may also perform calibration of one or more components of the marking device. For example, when a component of the marking device provides a response that does not meet specification, the component may be adjusted by appropriate signals sent by the diagnostics module 286 to meet specification.

Diagnostics module 286 may also be configured to perform self-diagnostics of the docking station. In this case, diagnostics module 286 may place the docking station in a diagnostics mode and may execute a diagnostics routine for testing some or all components of the docking station. The result of the diagnostics routine can be recorded and/or transmitted to the local or remote computing device.

The diagnostics module 286, in conjunction with timing system 260, may be configured to record a time and date when a diagnostics and/or calibration routine was performed. Diagnostics module 286, in conjunction with location tracking system 262, may be configured to record the geographical coordinates where a diagnostics and/or calibration routine was performed. The recording of diagnostics information may be important in establishing that the marking device and/or the docking station was functioning properly at a particular time and date and/or location.

Security module 288 may be configured to control various security components and functions of the docking station. In some embodiments, security module 288 may be configured to receive the ID of the marking device from ID reader 264 and compare the ID of the marking device with a list of approved marking device IDs. If the ID of the marking device does not match one of the approved marking device IDs in the list, operation of the docking station may be modified and/or terminated. For example, an alert can be generated by the docking station and/or an alert can be transmitted to the local or remote computing device. Furthermore, operations such as data transfer, battery charging and the like can be terminated when the ID of the marking device does not match an approved marking device ID.

In other embodiments, security module 288 may be configured to receive a user ID from user interface 256, such as via a keypad or other input device, and compare the user ID with a list of approved user IDs. In the absence of a match between the user ID and one of the approved user IDs, operation of the docking station can be modified or terminated and an alert can be generated as described above.

In further embodiments, security module 288 may be configured to control a locking mechanism, such as a safety strap, a locking bar or other locking device. The locking mechanism may secure the marking device or may secure an enclosure for the marking device, such as for example a weatherproof enclosure. Thus, for example, security module 288 may be configured to maintain the locking mechanism in a locked state if the user ID does not match one of the approved user IDs. In further embodiments, security module 288 may be configured, in conjunction with timing system 260, to maintain the locking mechanism in a locked state at specified times and dates, such as, for example, during nighttime, weekends and holidays. In further embodiments, security module 288 may be configured, in conjunction with location tracking system 262, to maintain the locking mechanism in a locked state when the docking station is outside specified geographical coordinates, is at specified geographical coordinates, or is within specified geographical coordinates. The specified geographical coordinates may indicate a location or area where removal of the marking device from the docking station is not permitted.

In further embodiments, the security module 288 may be configured to generate a user alert or notification when a marking device is not present in the docking station. Presence or lack of presence of the marking device may be detected, for example, by a sensor switch. In other embodiments, the security module 288 may be configured to generate a user notification or alert when the marking device is present in the docking station but is not secured in the docking station, for example, the marking device is not properly positioned or the locking mechanism is not engaged. In further embodiments, security module 288 may be configured to respond to a security command from a local or remote computing device. The security command may cause the security module 288 to terminate operations, to engage any locking mechanism and/or to shut down, for example.

It will be understood that the above described components and functions of the docking station may be utilized separately or in any combination. Furthermore, various components of the docking control electronics 250 shown in FIG. 4 and described above may be omitted from the docking station, within the scope of the invention. As noted above, battery charging may be a separate function not included in the docking station. The docking station, for example, may not include ID reader 264, timing system 260 and/or location tracking system 262 in particular applications and configurations. In some embodiments, the docking station may be controlled by the computing device, in which case, all or part of user interface 256 may be omitted. Depending on the configuration, various software modules may be omitted, and in other embodiments, additional software modules may be included in the docking station. As described above, some embodiments of the docking station may include minimal or no electronics, in which case the docking station serves as a holder for the marking device.

Figure 5A:
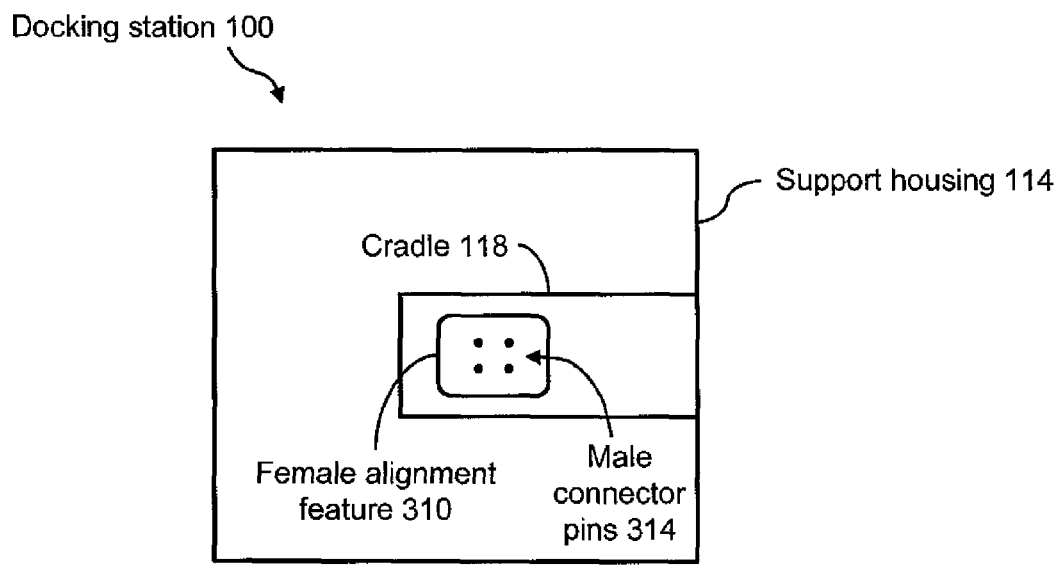
FIG. 5A is a top view of a portion of a docking station.
Figure 5B:
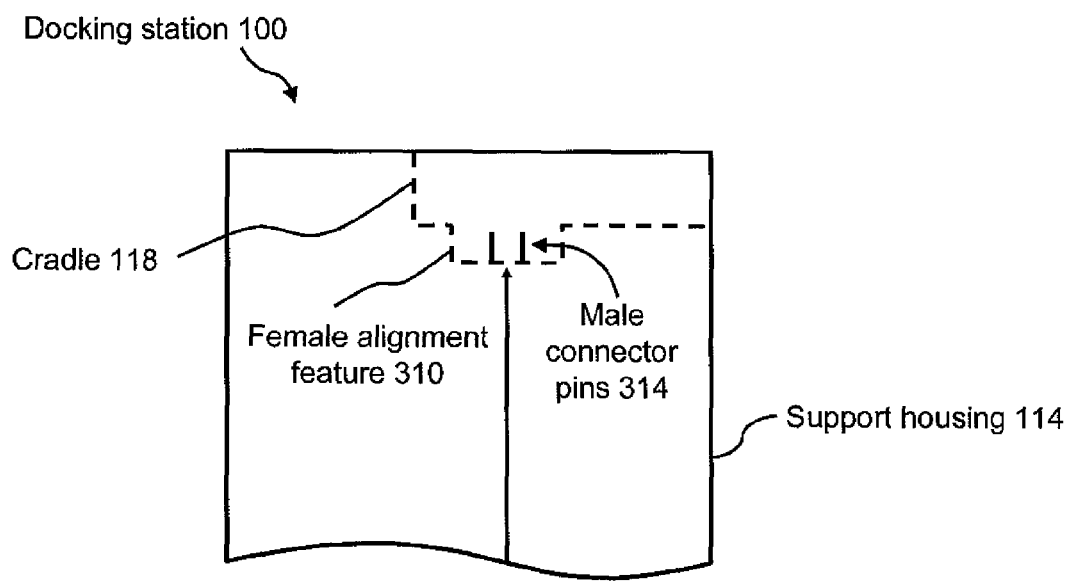
FIG. 5B is a side view of a portion of a docking station.

FIGS. 5A and 5B are top and side views, respectively, of a portion of docking station 100. FIGS. 5A and 5B illustrate that cradle 118 is recessed into the upper end of support housing 114. Additionally, a female alignment feature 310 is provided within cradle 118 and is recessed into support housing 114. Male connector pins 314 are arranged within female alignment feature 310, to which electrical signals and power are connected. The number, type, and arrangement of male connector pins 314 may vary according to the requirements of docking station 100. The dimensions of cradle 118 and female alignment feature 310 may vary according to the requirements of docking station 100.

Figure 6A:
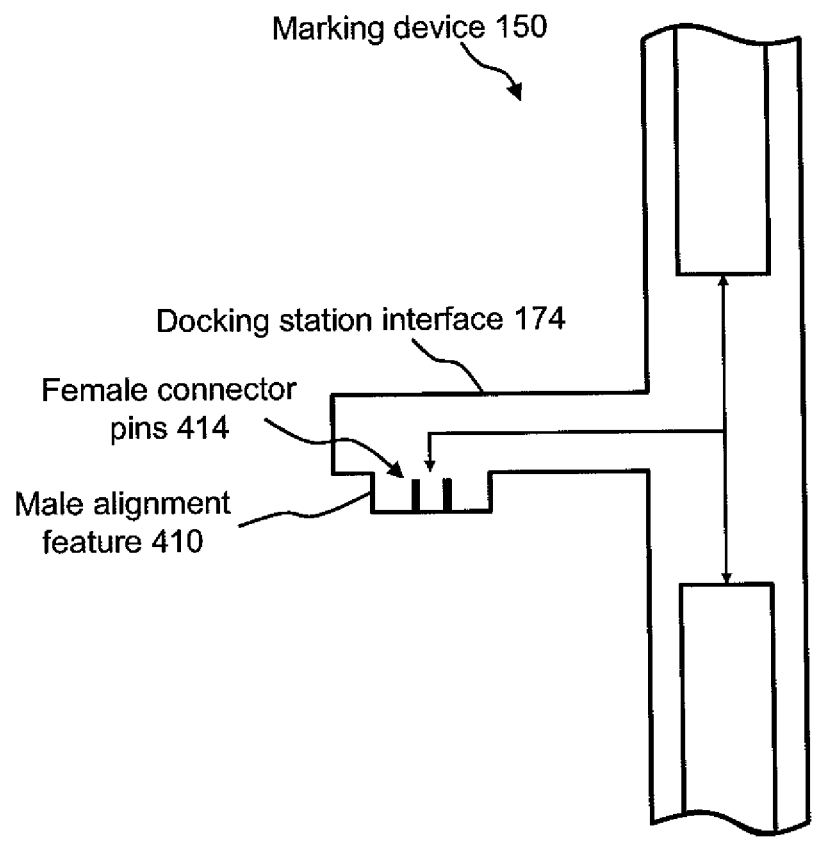
FIG. 6A is a side view of a portion of a marking device that may be attached to a docking station.
Figure 6B:
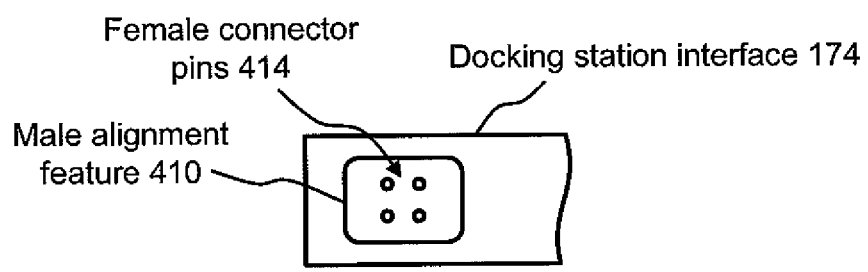
FIG. 6B is a bottom view of a portion of a marking device that may be attached to a docking station; docking station.
Figure 7:
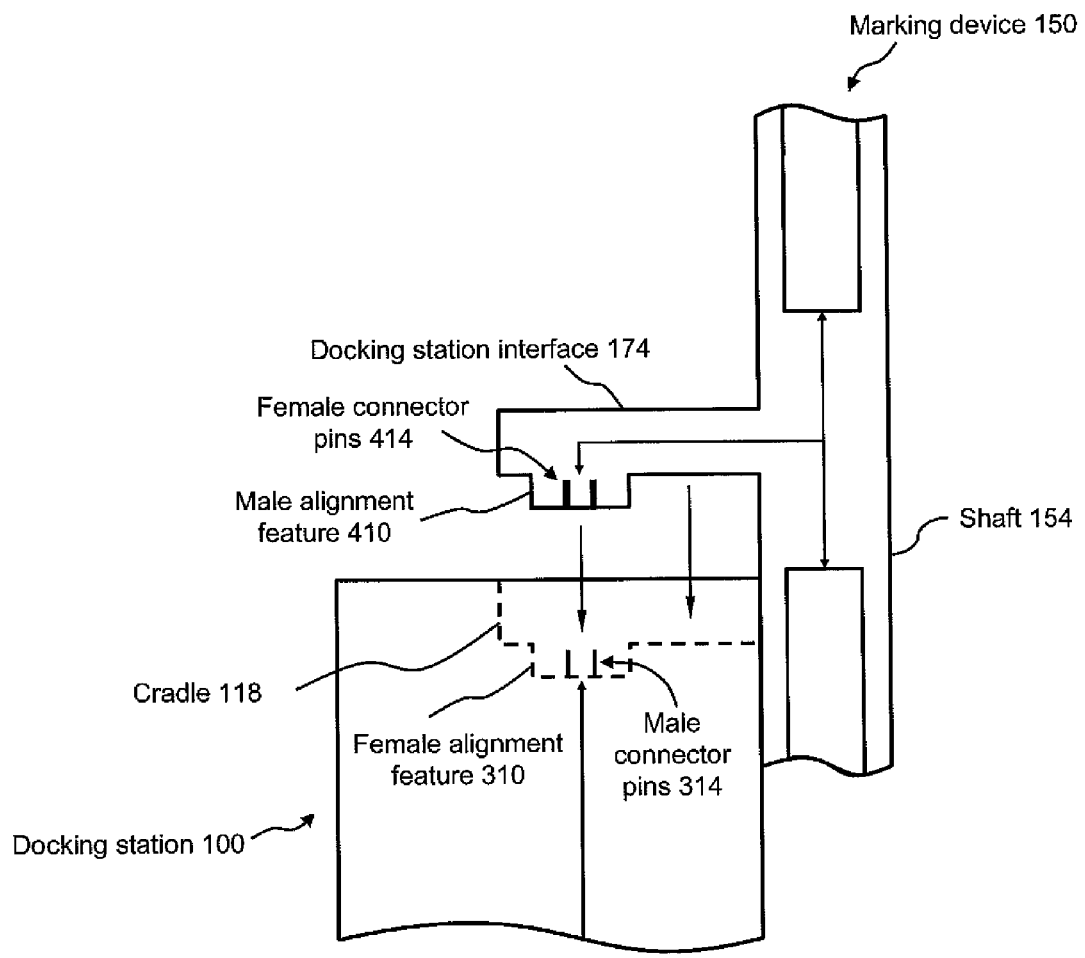
FIG. 7 is a side view of a marking device being attached to a FIG. 8A is a top view of an exemplary vehicle configuration incorporating a docking station.

FIGS. 6A and 6B are side and bottom views, respectively, of a portion of marking device 150. FIG. 7 is a side view of marking device 150 being attached to docking station 100. Docking station interface 174 of marking device 150 is designed to fit into cradle 118 of docking station 100. Accordingly, FIGS. 6A and 6B show that the geometry of docking station interface 174 is complementary to the geometry of cradle 118 of FIGS. 5A and 5B. For example, the body of docking station interface 174 is designed to fit within the recessed area of cradle 118. Further, a male alignment feature 410 is integrated into docking station interface 174. Male alignment feature 410 is designed to fit within the recessed female alignment feature 310 of cradle 118 shown in FIGS. 5A and 5B. A set of female connector pins 414 are arranged within male alignment feature 410, to which electrical signals and power are connected. The number, type, and arrangement of female connector pins 414 may vary according to the requirements of marking device 150 and docking station 100. Female connector pins 414 of marking device 150 are arranged to substantially align with the arrangement of male connector pins 314 of docking station 100. As a result, when marking device 150 is attached to docking station 100, male connector pins 314 fit into female connector pins 414 of marking device 150, providing an electrical connection therebetween, as shown in FIG. 7.

While FIGS. 5A, 5B, 6A, and 6B describe a pin and hole type of connection (e.g., male connector pins 314 fitting into female connector pins 414) between docking station 100 and marking device 150, this connection is exemplary. Those skilled in the art will recognize that any type of electrical connection mechanism may be used, such as, but not limited to, an induction coupling mechanism. In addition, the mechanical and electrical coupling between docking station 100 and marking device 150 can be at any convenient location on the two devices, with complementary elements on the two devices to facilitate coupling and decoupling. Furthermore, the mechanical and electrical coupling elements can be combined, as shown in FIGS. 5A, 5B, 6A, 6B and 7, or can be separate coupling elements.

As illustrated in FIG. 7, docking station interface 174 of marking device 150 fits into cradle 118 of docking station 100. In particular, male alignment feature 410 of docking station interface 174 having female connector pins 414 is aligned with and fit into female alignment feature 310 of cradle 118 that has male connector pins 314.

Figure 8A:
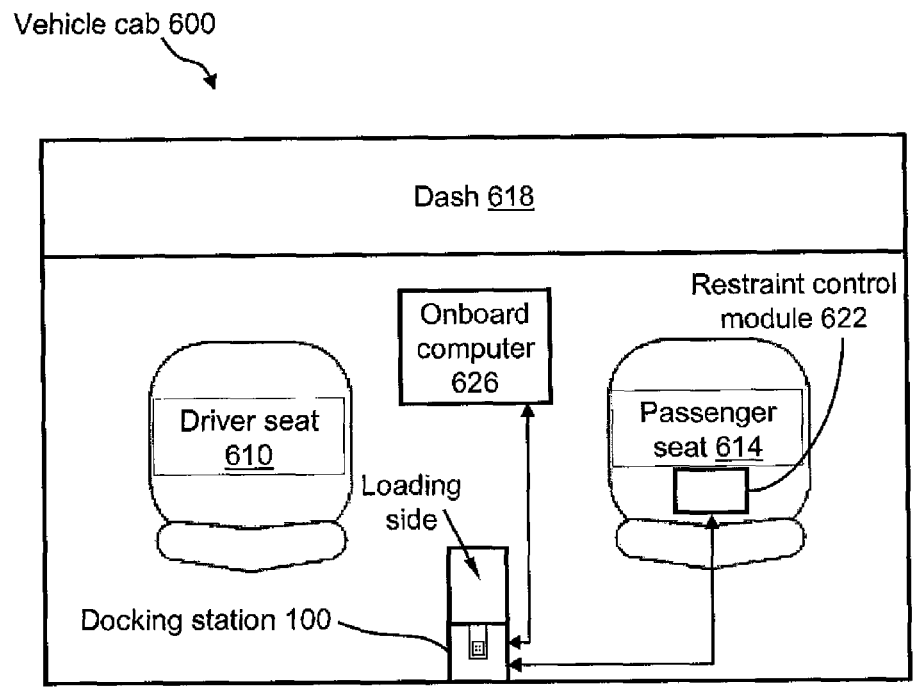
FIG. 8B is a top view of another exemplary vehicle configuration incorporating a docking station.
FIG. 8C is a schematic block diagram of a network system incorporating a docking station.

FIG. 8A is a top view of an exemplary configuration incorporating docking station 100. More specifically, FIG. 8A is a top view of a configuration incorporating docking station 100 in a vehicle cab 600 of the type typically used in the field. Vehicle cab 600 may include both a driver seat 610 and a passenger seat 614, which are facing a dash 618. In this mounting configuration, docking station 100 may be mounted to the back wall of vehicle cab 600 (i.e., the wall opposite dash 618) in a location that is substantially centralized between driver seat 610 and passenger seat 614 for ease of access. For example, docking station 100 may be secured to the back wall of vehicle cab 600 by use of security screws to prevent the unauthorized removal of docking station 100. Docking station 100 is positioned to face the front (i.e., toward dash 618) of vehicle cab 600 to allow for easy attachment and removal of marking device 150.

Docking station 100 may be wired directly into a vehicle's power system. Docking station 100 thus receives power simultaneously with other vehicle components (when the key is in the accessory, power, start, or run position), and powers down upon vehicle power off. In one embodiment, the design and construction of docking station 100 provides a power line and a ground line. Both lines may be spliced into, for example, a restraint control module 622 that is typically located directly under passenger seat 614 of the vehicle. As a result, docking station 100 receives power when restraint control module 622 receives power. Docking station 100 provides a battery charging mechanism for marking device 150 via the combination of the vehicle power and docking control electronics 128. In another embodiment, the docking station may charge the marking device at any time (including accessory, power, start, run or off positions), for example, at preset times before the beginning of a shift to ensure that the marking device is fully charged, or for a period of time after the vehicle is shut off at the end of a shift.

Additionally, FIG. 8A shows an onboard computer 626 within vehicle cab 600. Onboard computer 626 may be any computing device, such as, but not limited to, any laptop computer, handheld computer or onboard server that is capable of executing software applications related to operations of docking station 100 and marking device 150. In particular, there may be a wired connection, such as wired connection 140, between docking station 100 and onboard computer 626. In an embodiment, onboard computer 626 communicates with marking device 150 via a wireless communication link when within range. Also, when marking device 150 is attached to docking station 100, docking station 100 provides a wired communications link between onboard computer 626 and marking device 150. The type of information that may be exchanged between onboard computer 626 and marking device 150 may include, but is not limited to, marking data, timing data, GPS data, RFID data, status data, health data, software, and firmware updates, diagnostics information, and the like.

Figure 8B:
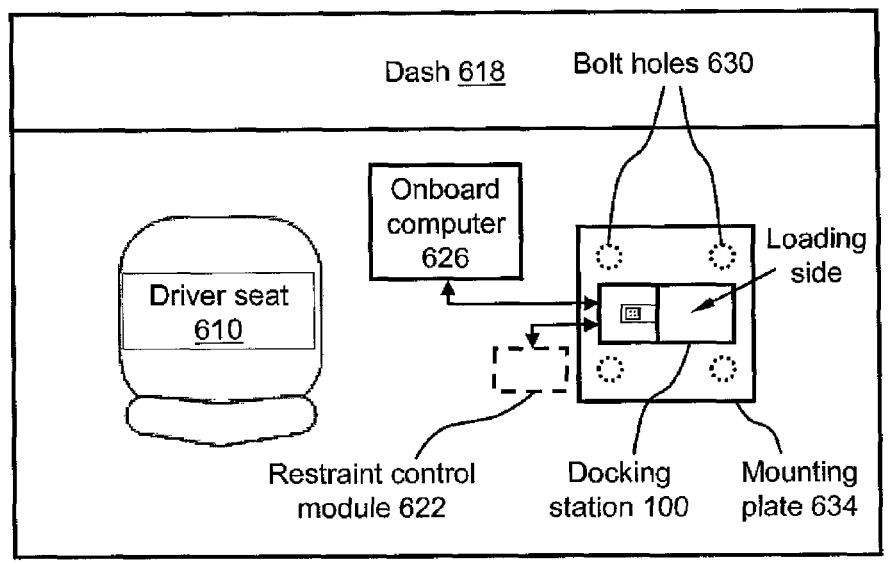

FIG. 8B is a top view of another embodiment incorporating docking station 100. In this mounting configuration, docking station 100 may be securely fastened to the floor of vehicle cab 600 in place of a passenger seat. In an embodiment, docking station 100 is securely bolted to the floor of vehicle cab 600 using, for example, a set of existing passenger seat bolt holes 630 in the floor of vehicle cab 600. Optionally, a mounting plate 634 may be provided at base 110 of docking station 100 for bolting to bolt holes 630. As depicted in FIG. 8B, a passenger seat is not present and restraint control module 622 may be located underneath the cab floor covering. As previously discussed, the power line and ground lines of docking station 100 may be spliced into restraint control module 622. Additionally, a USB or similar connection may be provided between docking station 100 and onboard computer 626. This mounting configuration allows docking station 100 to be installed without drilling additional holes in the floor of vehicle cab 600. As a result, docking station 100 is positioned in place of the passenger seat and may be oriented to allow easy access through the passenger door of vehicle cab 600.

FIGS. 8A and 8B illustrate embodiments where the docking station is mounted within a vehicle cab. It will be understood that the docking station can be mounted in any convenient location in a vehicle. For example, docking station may be mounted in the bed of a truck, in the rear of a van, within a panel truck or trailer, or in any other desired location. Further, the docking station can retain the marking device in any desired orientation, such as vertical, horizontal or any other desired orientation. In addition, any number of docking stations can be mounted in a vehicle.

In some embodiments, the docking station may include a weatherproof enclosure for the marking device. The weatherproof enclosure may be beneficial, for example, when the docking station is exposed to the weather, such as in the bed of a truck. The weatherproof enclosure may also provide enhanced security and may include a locking mechanism.

Figure 8C:
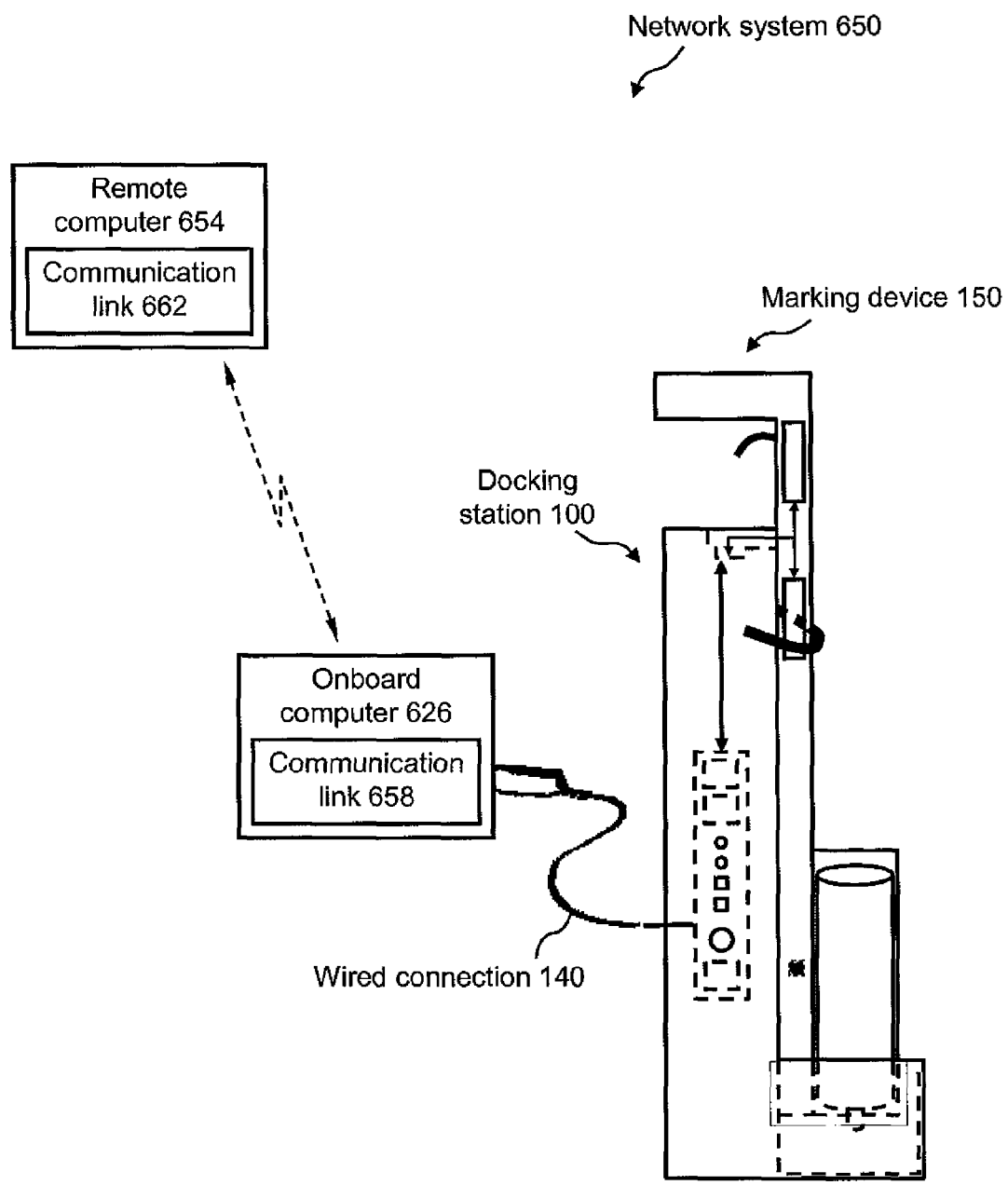

FIG. 8C is a functional block diagram of a network system 650 that includes the mobile docking station 100. More specifically, network system 650 includes one or more mobile docking stations 100 and one or more associated marking devices 150. Each mobile docking station 100 of network system 650 may be connected to onboard computer 626 of the vehicle in which it is installed, as shown in FIGS. 8A and 8B. In another embodiment, onboard computer 626 may be any on-site computer, and is not limited to a computer in a vehicle. Additionally, each onboard computer 626 or other on-site computer of network system 650 may be connected to a remote computing device, such as remote computer 654. Remote computer 654 may be a centralized computer, such as a central server of, for example, the locate service provider.

In order to facilitate the network connection, each onboard computer 626 or other on-site computer includes a communication link 658. Likewise, remote computer 654 includes a communication link 662. Communication link 658 and communication link 662 may be any wired and/or wireless communication interface by which information may be exchanged. Examples of wired communication interfaces may include, but are not limited to, USB ports, RS232 connectors, RJ45 connectors, Ethernet, and any combinations thereof. Examples of wireless communication interfaces may include, but are not limited to, an Intranet connection, Internet, Bluetooth® technology, Wi-Fi, Wi-Max, IEEE 802.11 technology, radio frequency (RF), Infrared Data Association (IrDA) compatible protocols, Local Area Networks (LAN), Wide Area Networks (WAN), Shared Wireless Access Protocol (SWAP), combination thereof, and other types of wireless networking protocols. The wireless interface may be capable of capturing signals that reflect a user's intent. For example, the wireless interface may include a microphone that can capture a user's intent by capturing the user's audible commands. The wireless interface may also interact with a device that monitors a condition of the user, such as eye movement, brain activity, and/or heart rate.

Figure 9:
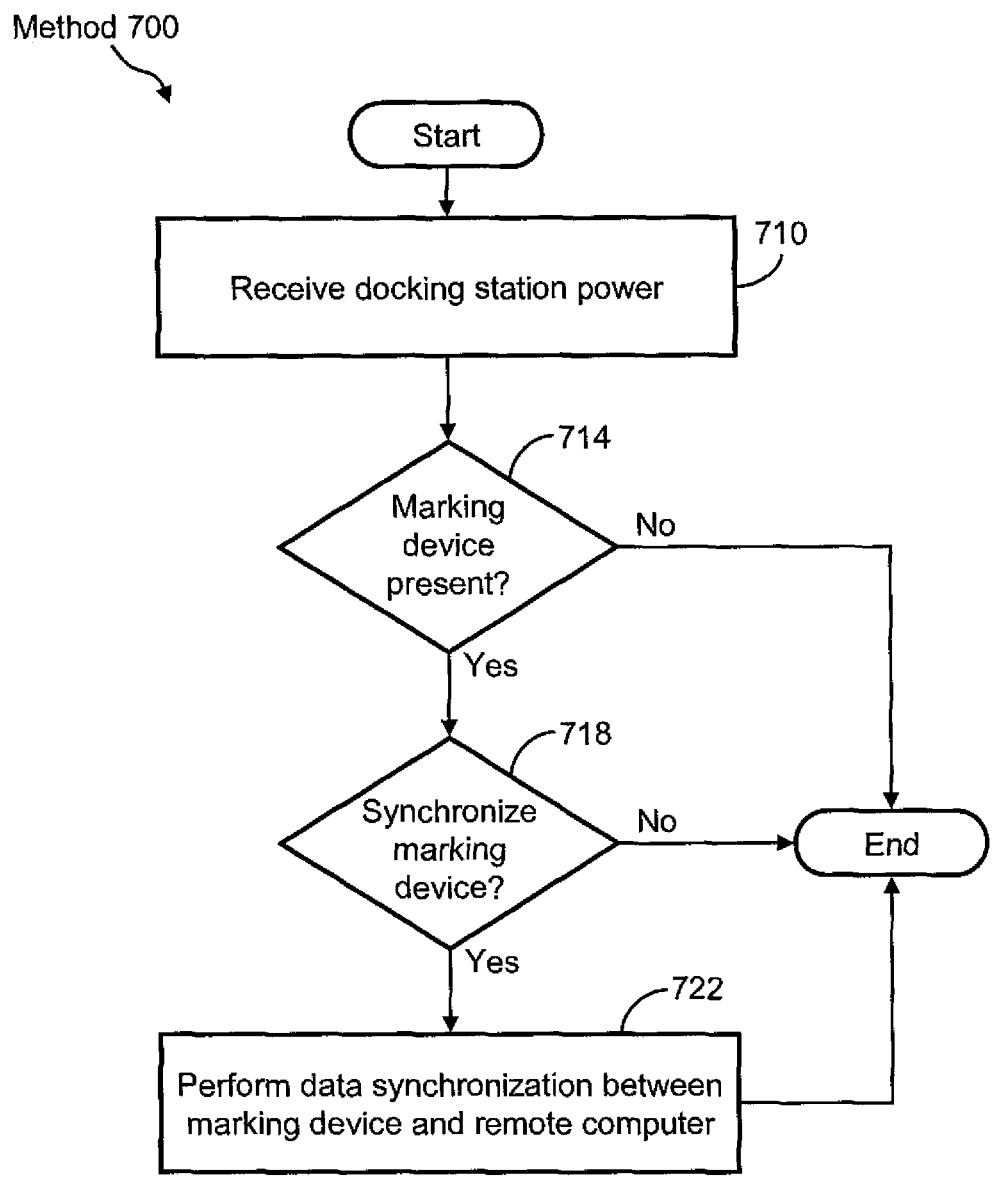
FIG. 9 is a flow diagram of a method of using a docking station; station.

FIG. 9 is a flow diagram of a method 700 of using a docking station according to embodiments of the invention. In particular, FIG. 9 is a flow diagram of method 700 of synchronizing the data of, for example, marking device 150 with a local or remote computer, such as onboard computer 626, when detected in docking station 100. Method 700 may include, but is not limited to, the following acts, which are not limited to any order.

In act 710, the docking station receives power. For example, when docking station 100 is installed in a vehicle, as shown in FIGS. 8A and 8B, docking station 100 receives direct current (DC) power when the vehicle key is in the accessory, power, start, or run position.

In act 714, it is determined whether a marking device 150 is present in the docking station 100. For example, using software of onboard computer 626, queries of docking station 100 may be performed in order to determine the presence or absence of marking device 150. In one embodiment, onboard computer 626 may query the RFID reader of docking station 100 in order to determine whether RFID data is returned. More specifically, when marking device 150 is present in docking station 100, RFID data is returned from its RFID tag 178 to onboard computer 626 by the RFID reader 129 of docking station 100. By contrast, when marking device 150 is not present in docking station 100, no RFID data is returned to onboard computer 626 from docking station 100.

In another example, a logic state may be returned from docking control electronics 128, depending upon whether an electrical connection exists between docking station 100 and marking device 150 (e.g., between male connector pins 314 of docking station 100 and female connector pins 414 of marking device 150). This may be referred to as "docking pin awareness." Other methods of determining whether a marking device is present in the docking station are possible, such as pressure sensors and any number of other solutions. If it is determined that marking device 150 is present in docking station 100, method 700 proceeds to act 718. If it is determined that marking device 150 is not present in docking station 100, method 700 ends.

In act 718, it is determined whether a data synchronization operation is needed between the marking device and the local or remote computer. Data synchronization is the process by which the local or remote computer receives data that was not previously exchanged between the marking device and the local or remote computer. For example, using software of onboard computer 626, it may be determined whether a data synchronization operation is needed between marking device 150 and onboard computer 626. For example, onboard computer 626 interrogates the data (e.g., marking data, timing data, GPS data, RFID data, and the like) that may be stored on marking device 150 and checks a flag, such as a send/acknowledge flag, to determine whether a packet of data was transmitted and received successfully. When the expected flags are present, onboard computer 626 skips over that packet of data in order to avoid collecting duplicate data. Any data that was not successfully transmitted and/or received is transmitted from marking device 150 to onboard computer 626 (or remote computer via wireless communication) via the USB or similar connection between docking station 100 and onboard computer 626. If it is determined that a data synchronization operation is needed, method 700 proceeds to act 722. If it is determined that a data synchronization operation is not needed, method 700 ends.

In act 722, a data synchronization operation is performed between the marking device 100 and the remote or local computer. For example, a data synchronization operation is performed between marking device 150 and onboard computer 626 via the USB connection between docking station 100 and onboard computer 626. Once the data is synchronized, method 700 ends.

Referring again to method 700 of FIG. 9, docking station 100 communicates with onboard computer 626 and, if appropriate, may begin synchronizing data immediately when marking device 150 is detected in docking station 100. Alternatively, a manual control 134, such as the "initiate data synchronization" push button of docking station 100 allows the operator to manually perform synchronization at any time. Also, data synchronization may occur automatically upon the docking of the marking device.

A data synchronization operation is described above in connection with FIG. 9. It will be understood that communication between docking station 100 and marking device 150 may include any control and/or data transfer function, including but not limited to issuing commands to marking device 150, receiving status and other operating information from marking device 150, downloading ticket information and other operating parameters, uploading information of any type, performing diagnostics, and the like.

Figure 10:
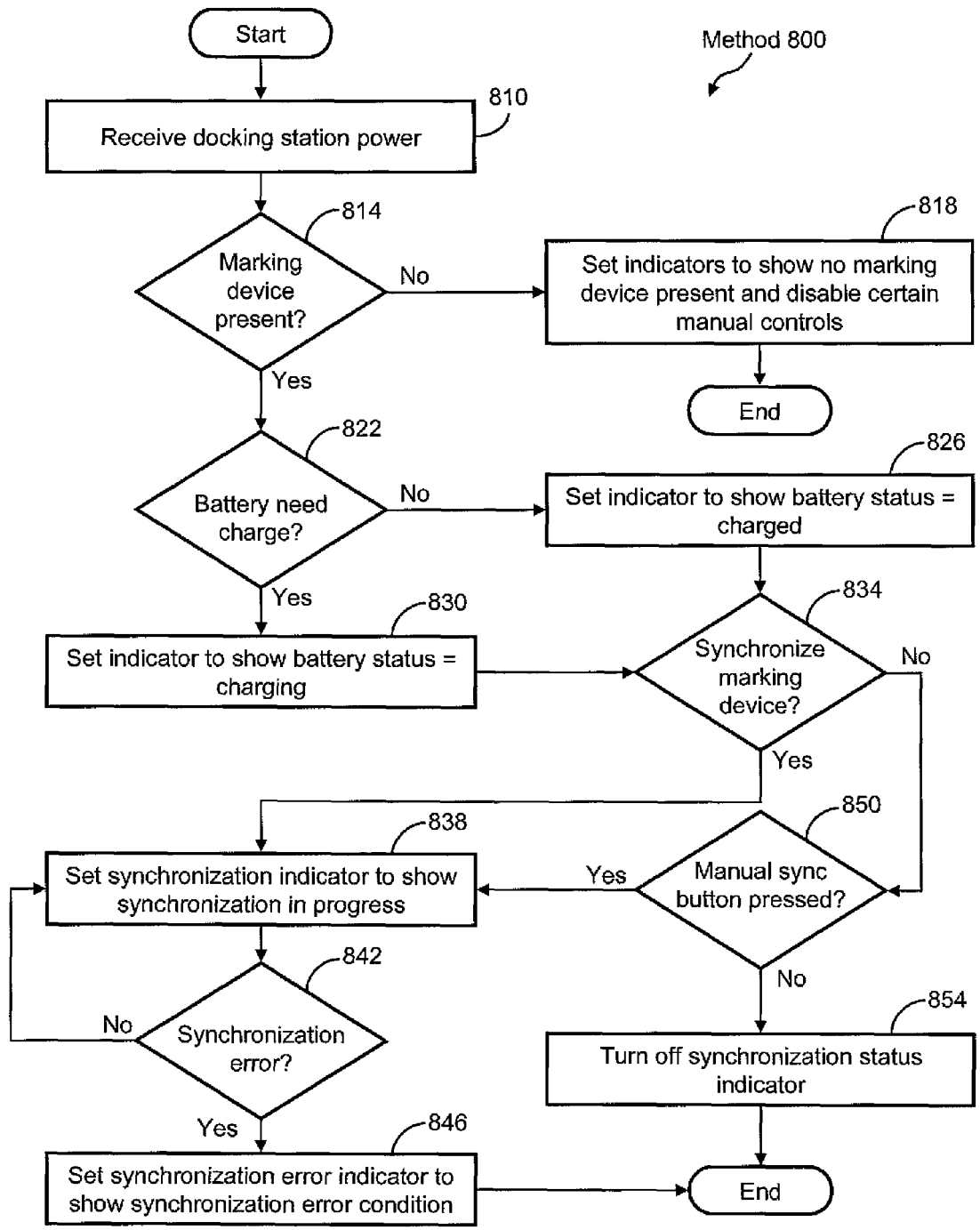
FIG. 10 is a flow diagram of another method of using a docking

FIG. 10 is a flow diagram of another method of using a docking station. In particular, FIG. 10 is a flow diagram of a method 800 of managing the indicators and/or manual controls of docking station 100 when a marking device, such as marking device 150, is detected therein. Method 800 informs the user of status changes and other conditions that may require attention. Method 800 may include, but is not limited to, the following acts, which are not limited to the following order.

In act 810, the docking station receives power. For example, when docking station 100 is installed in a vehicle, as shown in FIGS. 8A and 8B, docking station 100 receives DC power when the vehicle key is in the accessory, power, start, or run position.

In act 814, it is determined whether a marking device is present in the docking station. For example, if it is determined that marking device 150 is not present in docking station 100, method 800 proceeds to act 818. If it is determined that marking device 150 is present in docking station 100, method 800 proceeds to act 822. The presence or absence of marking device 150 in docking station 100 may be determined as described above in connection with FIG. 9.

In act 818, indicators 130 are set to show that no marking device is present and certain manual controls are disabled. For example, a red battery status indicator and a red synchronization status indicator may be turned on, and the initiate data synchronization push button may be deactivated.

In act 822, it is determined whether the power source, for example, a battery, of marking device 150 needs charging. For example, onboard computer 626 interrogates control electronics 170 of marking device 150 in order to determine the health status of rechargeable batteries 172. If it is determined that rechargeable batteries 172 of marking device 150 do not need charging, method 800 proceeds to act 826. If it is determined that rechargeable batteries 172 of marking device 150 do need charging, method 800 proceeds to act 830.

In act 826, an indicator 130 is set to show battery status=charged. For example, a green battery status indicator may be turned on. Method 800 proceeds to act 834.

In act 830, an indicator 130 is set to show battery status=charging. For example, a yellow battery status indicator may be turned on and caused to blink Alternatively, in the case of total battery failure, a red battery failure indicator may be turned on in order to show a defective battery in marking device 150.

In act 834, it is determined whether a data synchronization operation is needed between the marking device and the local or remote computer. For example, if it is determined that a data synchronization operation is needed, method 800 proceeds to act 838. However, if it is determined that a data synchronization operation is not needed, method 800 proceeds to act 850. The need for a synchronization operation may be determined as described above in connection with FIG. 9.

In act 838, an indicator 130 is set to show synchronization is in progress. For example, an orange synchronization status indicator may be turned on and caused to blink. In act 842, it is determined whether a data synchronization error condition is present. For example, onboard computer 626 determines whether a data synchronization error condition has been identified. If a data synchronization error condition is not present, method 800 returns to act 838. If a data synchronization error condition is present, method 800 proceeds to act 846.

In act 846, an indicator 130 is set to show whether a data synchronization error condition is present. For example, a red synchronization error indicator may be turned on and caused to blink. In act 850, it is determined whether the initiate data synchronization push button of docking station 100 has been pushed. For example, onboard computer 626 interrogates docking control electronics 128 of docking station 100 to determine the status thereof. If it is determined that the initiate data synchronization push button has been pushed, method 800 proceeds to act 838. If it is determined that the initiate data synchronization push button has not been pushed, method 800 then proceeds to act 854.

In act 854, an indicator 130 is deactivated. For example, the orange synchronization status indicator may be turned off.

Figure 11:
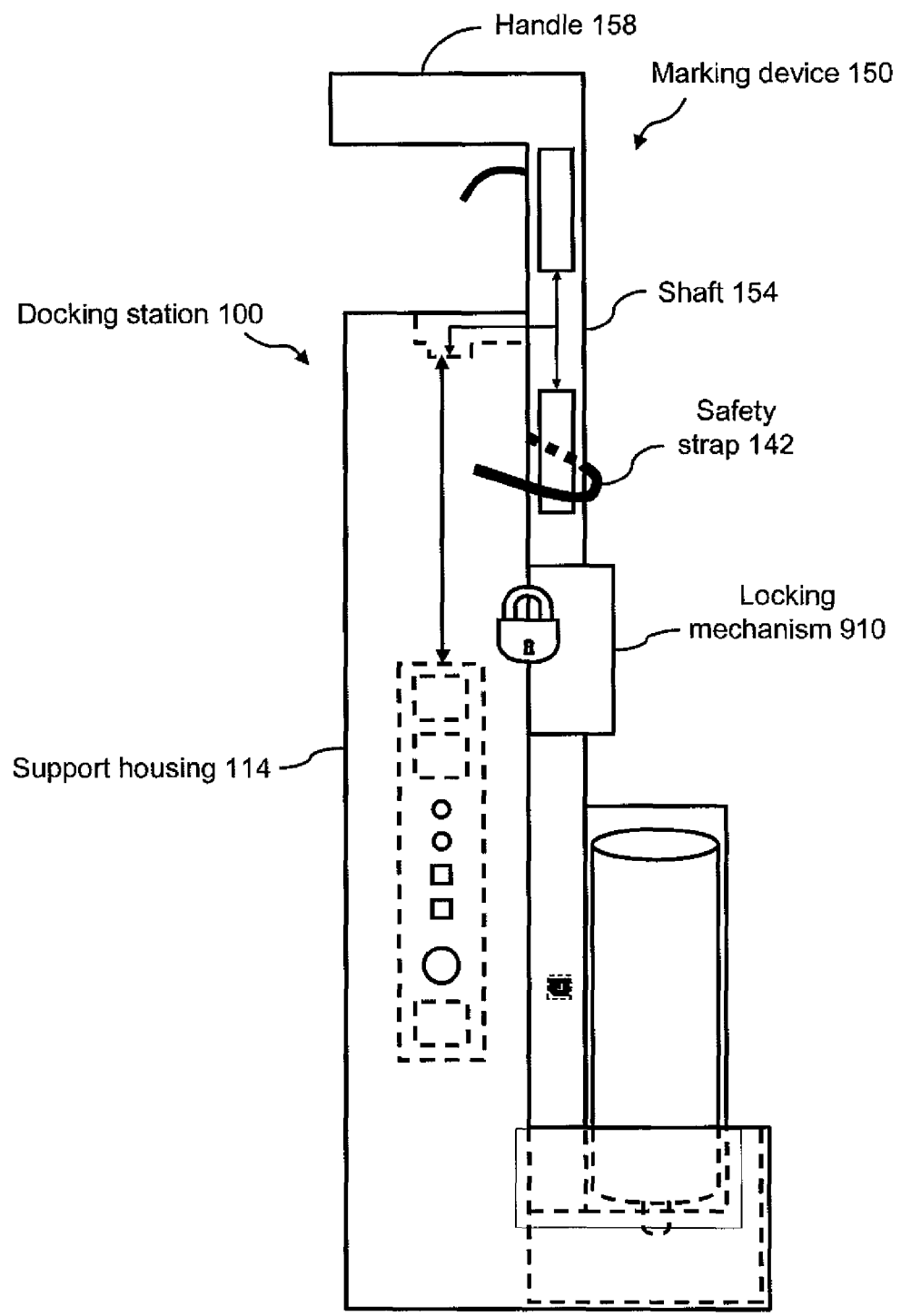
FIG. 11 is a schematic diagram of a marking device attached to a docking station, according to another embodiment of the invention; docking station.

FIG. 11 is a schematic diagram of a marking device attached to a docking station. In particular, FIG. 11 depicts a side view of marking device 150 attached to docking station 100. Docking station 100 further includes a locking mechanism 910. In addition to safety strap 142, marking device 150 may be lockable within a vehicle via the optional locking mechanism 910 of FIG. 11. In one embodiment, locking mechanism 910 may be a suitably rigid, strong, and tamper-proof bracket (e.g., hinged bracket) that is installed on support housing 114. Locking mechanism 910 may include a switch or lever (not shown) to ensure that marking device 150 is properly secured within docking station 100 during driving (i.e., for safety) in the event of an accident, as well as to ensure proper charging and data transfer. A keyed lock, such as a padlock, may be used to secure marking device 150 against theft.

Figure 12:
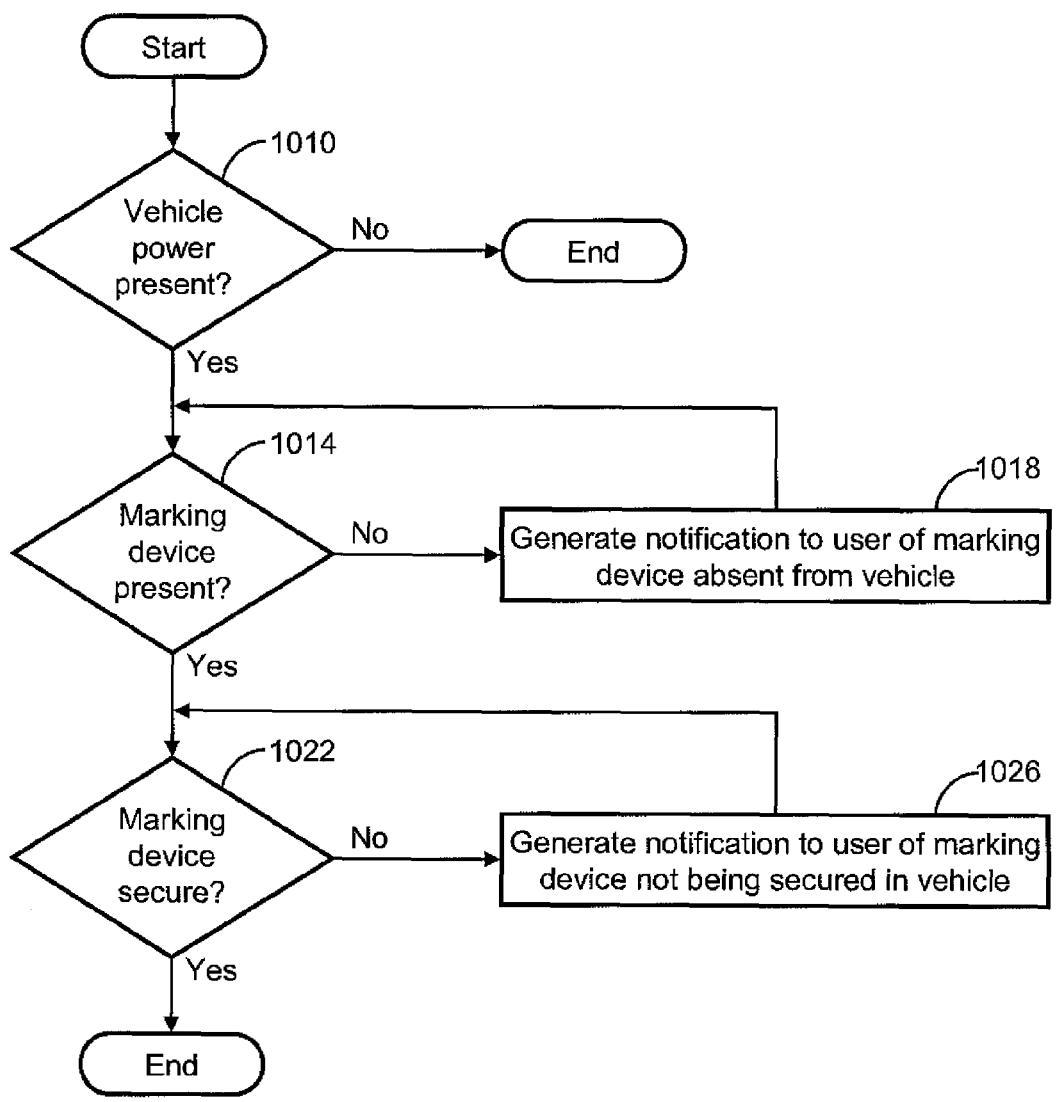
FIG. 12 is a flow diagram of an additional method of using a FIG. 13 is a schematic diagram of an exemplary configuration incorporating docking stations.

FIG. 12 is a flow diagram of a method of using a docking station. In particular, FIG. 12 illustrates a method 1000 of notifying the user of the presence and security of the marking device in docking station 100. Method 1000 may provide an audible means of informing the user of the presence and security of marking device 150 in docking station 100. Method 1000 may include, but is not limited to, the following acts, which are not limited to the following order.

In act 1010, it is determined whether docking station 100 is receiving power. For example, when docking station 100 is installed in a vehicle, such as shown in FIGS. 8A and 8B, docking station 100 receives DC power when the vehicle key is in the accessory, power, start, or run position. If onboard computer 626 determines that vehicle power is present, method 1000 proceeds to act 1014. If onboard computer 626 determines that vehicle power is not present, method 1000 ends.

In act 1014, it is determined whether a marking device 150 is present within the docking station. For example, if it is determined that marking device 150 is not present in docking station 100, method 1000 proceeds to act 1018. If it is determined that marking device 150 is present in docking station 100, method 1000 proceeds to act 1022. The presence or absence of marking device 150 in docking station 100 may be determined as described above in connection with FIG. 9.

In act 1018, an audible notification is generated to the user that the marking device 150 is absent from the docking station 100 within the vehicle. For example, a buzzer (via audio output 138 of docking station 100) may be triggered until the vehicle is shut off or until marking device 150 is placed in docking station 100. Thus, it may be ensured that the user returns marking device 150 to the vehicle after each use. Method 1000 then returns to act 1014.

In act 1022, it is determined whether the marking device is secure within the docking station 100. For example, onboard computer 626 determines the status of safety strap 142 and/or the switch or lever of locking mechanism 910 in order to determine whether such items are in a secure state. If it is determined that marking device 150 is secure in docking station 100, method 1000 ends. If it is determined that marking device 150 is not secure in docking station 100, method 1000 proceeds to act 1026.

In act 1026, an audible notification is generated, indicating to the user that the marking device is not secure in docking station 100 within the vehicle. For example, a buzzer (via audio output 138 of docking station 100) may be triggered until the vehicle is shut off or until marking device 150 is placed in docking station 100. This ensures that marking device 150 is physically secure in the vehicle while the vehicle is moving. Method 1000 then returns to act 1022.

Figure 13:
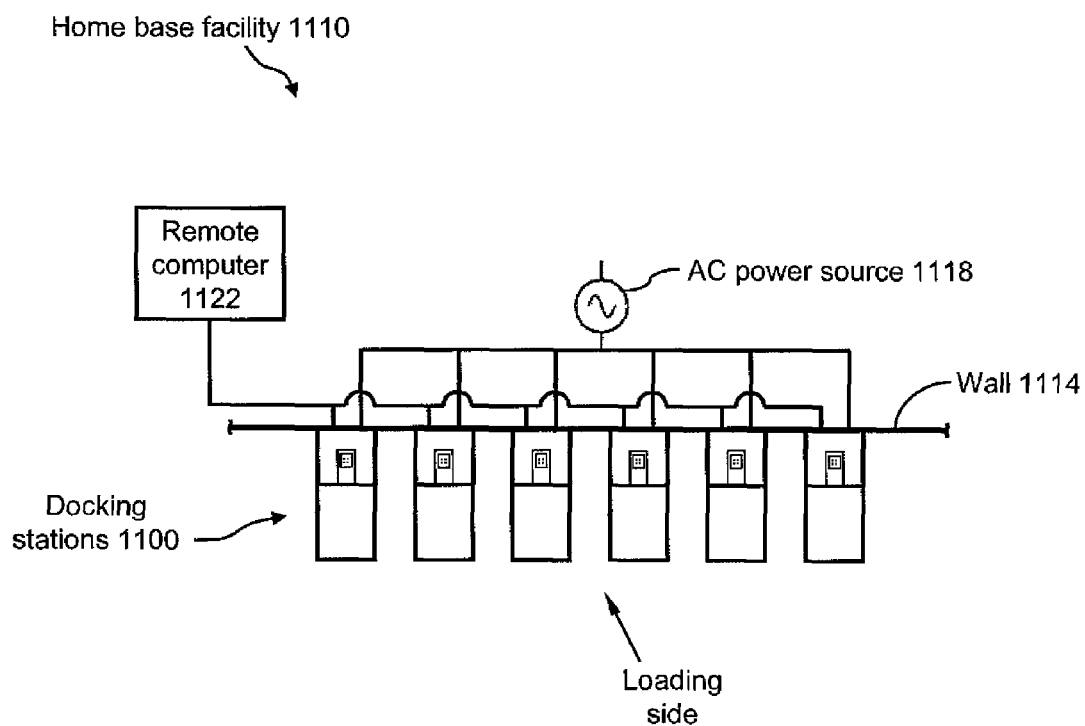

FIG. 13 is a schematic diagram of an exemplary configuration incorporating docking stations. In particular, FIG. 13 is a schematic diagram of a bank of one or more docking stations 1100, which may be fixed and suitable for use with at least one marking device. For example, FIG. 13 shows a home base facility 1110 at which a bank of docking stations 1100 are installed along a wall 1114. In another configuration, the bank of docking stations 1100 may be installed on the floor or a table. Each docking station 1100 may be substantially the same as docking station 100 as depicted in FIGS. 1 through 12, except that its power source may be designed and constructed to utilize an alternating current (AC) power source (e.g., an AC power source 1118), instead of the DC power of a vehicle. A shielded power cord terminated in a three (3) prong plug may be used. The bank of docking stations 1100 may also be powered by direct current (DC) power sources. Like docking station 100, each docking station 1100 allows a marking device, such as marking device 150, to be attached and detached easily for charging and, where applicable, for data synchronization.

Each docking station 1100 is designed and constructed to be mounted against a fixed structure such as a wall. In addition, each docking station 1100 is designed and constructed of materials that prevent unauthorized removal thereof. The bottom of each docking station 1100 may be flat in order to allow for placement on the floor of a building or on a table. Each docking station 1100 may be affixed to the floor and/or wall using security screws to prevent the unauthorized removal of the docking station. A variety of attachment means may be used to affix docking stations 1100. In addition, each docking station 1100 may be positioned to allow the easy attachment and removal of a marking device.

Docking station 100 and where applicable, docking station 1100, may support the synchronization of the marking device to a local or remote computer, such as a remote computer 1122, which may be, for example, a host server. This synchronization may be performed through the use of a USB cable. Upon attachment of the marking device, each docking station 1100 may determine whether or not data synchronization is necessary and, if it is, perform substantially the same data synchronization process that is shown in method 700 of FIG. 9 and described above.

The status indicators and device controls of each docking station 1100 may be substantially the same as those of docking station 100. A method of managing the indicators and/or manual controls of each docking station 1100 may be substantially the same as method 800 of FIG. 10 for docking station 100.

In another embodiment, each docking station 1100 may include a cleaning mechanism at the base thereof for cleaning any components that may be installed at the marking dispenser holder end of a marking device. An example of a cleaning mechanism may be a compact ultrasonic cleaning station that utilizes cleaning fluid, such as, but not limited to, isopropyl alcohol.

Figure 14:
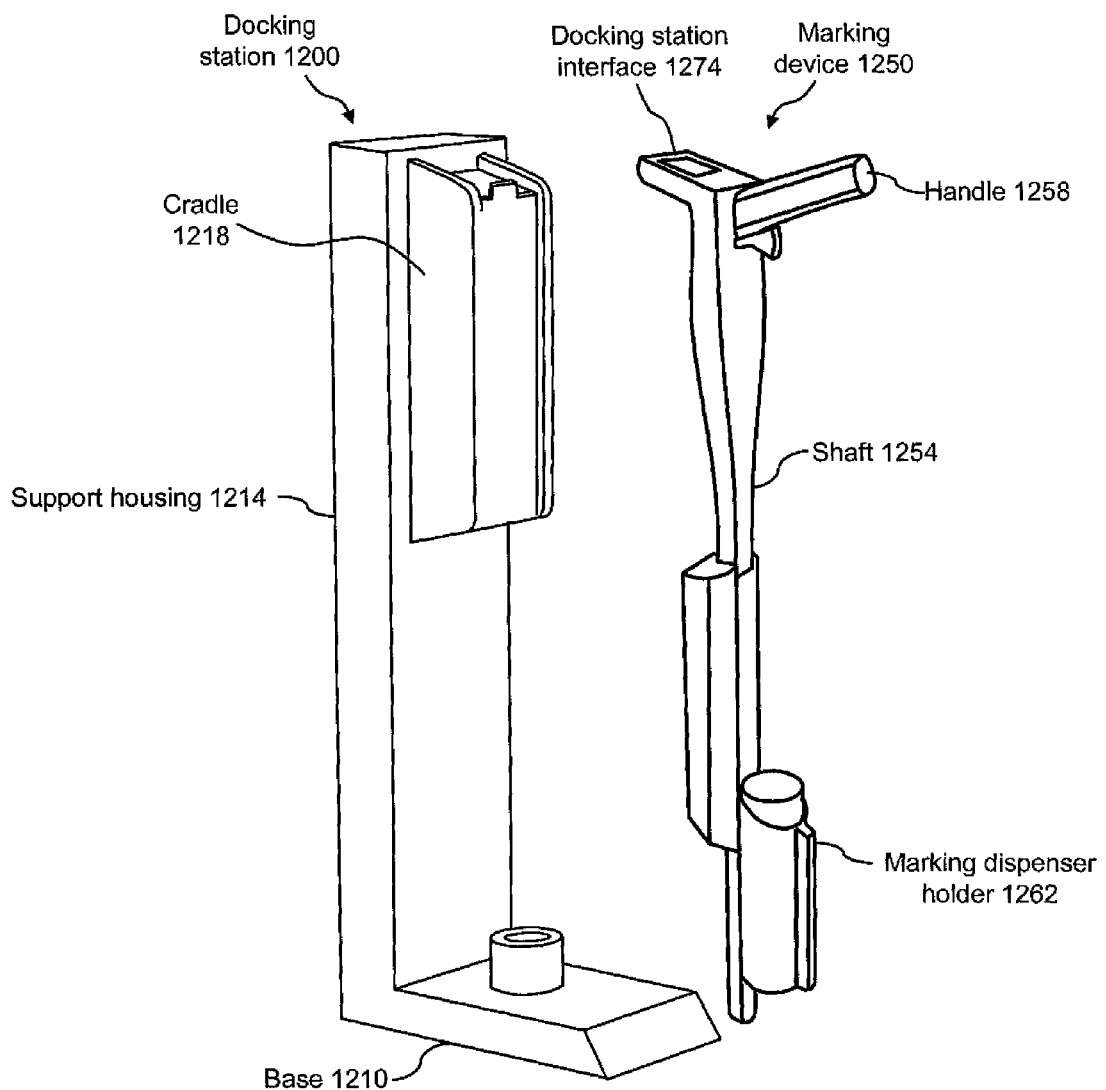
FIG. 14 is a perspective view of an embodiment of a docking station and a marking device, with the marking device removed from the docking station.
Figure 15:
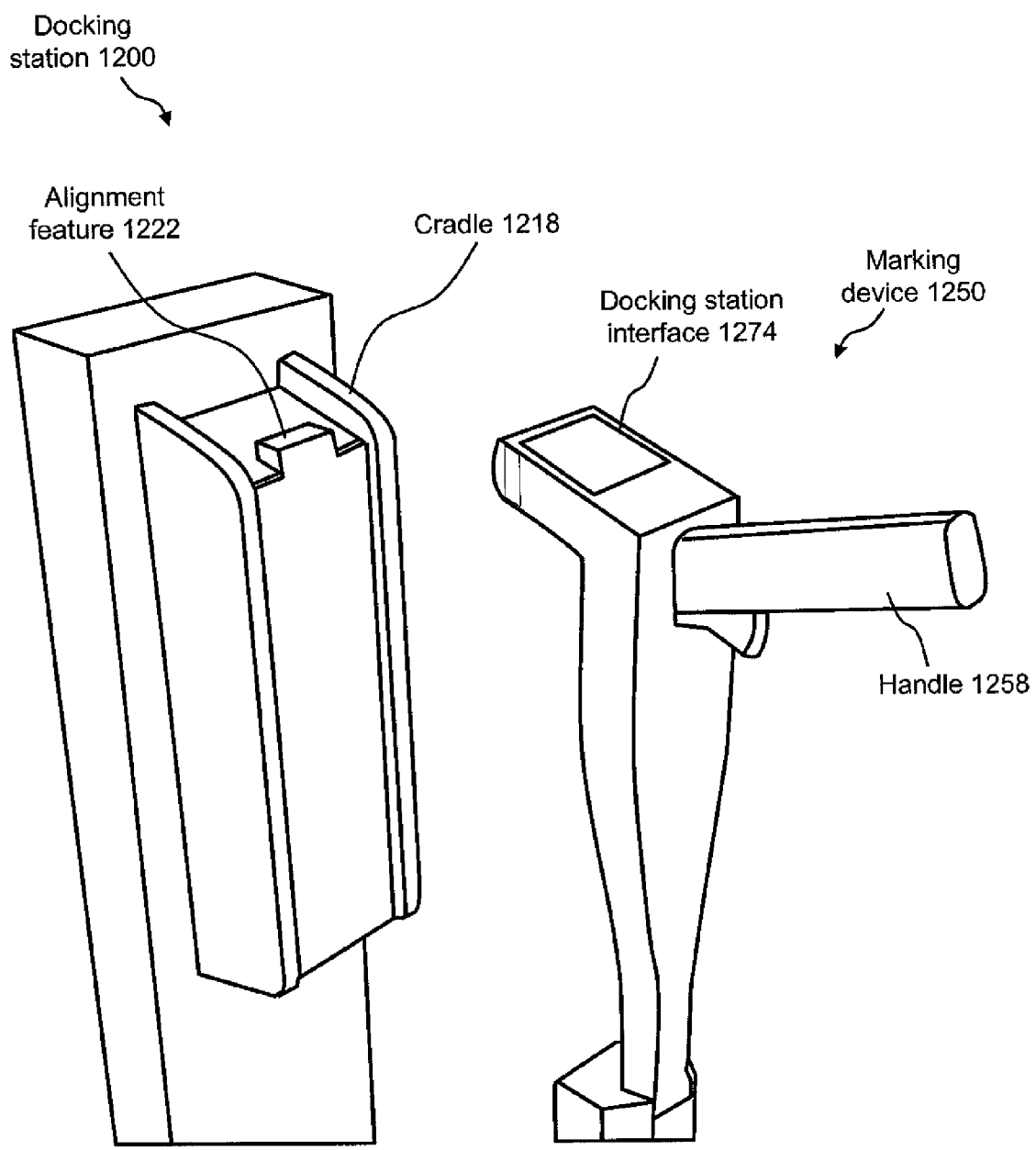
FIG. 15 is an enlarged perspective view of a portion of the docking station and marking device of FIG. 14.
Figure 16:
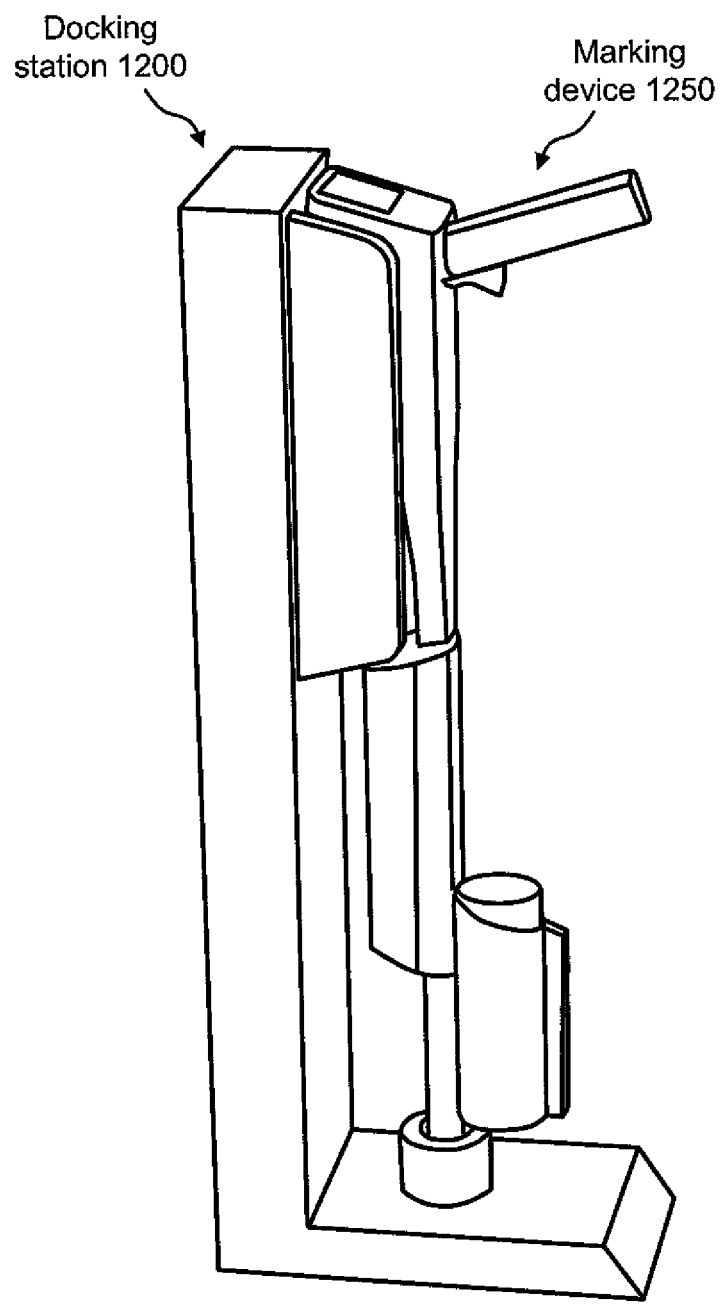
FIG. 16 is a perspective view of the docking station with the marking device docked therein.

FIGS. 14, 15, and 16 are perspective views of another embodiment of the docking station according to the present invention. FIG. 14 depicts a docking station 1200 for docking a marking device 1250. Docking station 1200 may be an example of another embodiment of both docking station 100 and docking station 1100, which may be in a variety of locations in fixed or mobile configurations.

In this embodiment of the docking station, docking station 1200 may include a base 1210, a support housing 1214, and a cradle 1218. The functions of base 1210, support housing 1214, and cradle 1218 are substantially the same as the functions of base 110, support housing 114, and cradle 118, respectively, of FIGS. 1 through 13. Docking station 1200 of FIGS. 14, 15, and 16 differs primarily from docking station 100 and docking station 1100 of FIGS. 1 through 13 in its physical attributes.

In this embodiment of the docking station, marking device 1250 may include a shaft 1254, a handle 1258, a marking dispenser holder 1262 and a docking station interface 1274. The functions of shaft 1254, handle 1258, marking dispenser holder 1262, and docking station interface 1274 are substantially the same as the functions of shaft 154, handle 158, marking dispenser holder 162 and docking station interface 174, respectively, of FIGS. 1 through 13. Marking device 1250 of FIGS. 14, 15, and 16 differs primarily from marking device 150 of FIGS. 1 through 13 in its physical attributes. In particular, in this embodiment, docking station interface 1274 is incorporated on the side of shaft 1254 that is opposite handle 1258. By contrast and referring to FIG. 1, docking station interface 174 of marking device 150 is incorporated on the same side of shaft 154 as handle 158.

With reference to FIGS. 14 and 16, respectively, marking device 1250 is shown separated from and attached to docking station 1200. FIG. 15 shows further details of docking station 1200. More specifically, FIG. 15 shows an alignment feature 1222 of cradle 1218 that provides the electrical and mechanical coupling to a corresponding alignment feature (not visible) of docking station interface 1274 of marking device 1250.

Additional security features may be incorporated into the docking stations described herein (e.g., docking station 100, docking station 1100 and docking station 1200). For example, in addition to the physical locking mechanism, the docking stations may be equipped with a positive identification mechanism. This positive identification mechanism (not shown) is provided to ensure that the user is authorized to remove the marking device from the docking station. This mechanism may include biometric, RFID, passcode, or any other means of positively identifying the user. For example, using intelligence that may be incorporated into docking stations, in order to unlock the marking device, the user may be prompted to provide input that validates that he/she is authorized to use the marking device. In the event that the proper credentials are supplied, the locking mechanism of the docking station releases the marking device to the user. If improper credentials are supplied, the docking station may enter a security lockdown mode, trigger a remote alert to a supervisor of the user, and/or trigger an audible or visible alarm indicating that it is not available for use.

In this embodiment, the docking stations may not allow the user to remove the marking device until positive identification, as explained above, has been provided. In this embodiment, the biometric, RFID, passcode or any other means shall be a feature of the docking stations and provide enhanced security to the physical locking measures (e.g., strap and padlock) already described.

In an embodiment and with regard to docking station 100, an audible security alarm may be tied into existing vehicle alarms, such as an alarm that sounds when the key is left in the ignition when the user opens the door, when the lights are left on or when the user opens the door and so on. Alternatively, the vehicle may be disabled from starting if marking device 150 is not properly secured in docking station 100.

In another embodiment and with regard to docking stations 1100 and 1200, a supervisor of a user may view (e.g., using a graphical user interface (GUI) of remote computer 1122) the status of docking stations 1100 and 1200, such as whether a marking device 150 is present and properly secured or not.

The docking stations of the present invention (e.g., docking station 100, docking station 1100, and docking station 1200) are not limited to use with a portable marking device. The docking stations may be suitable for use with other types of portable devices. In an embodiment, the docking stations described herein may accommodate and function with a locate device or similar instrument for detecting facilities. Moreover, the docking stations described herein may also accommodate and function with a combination marking and locate device.

Figure 17:
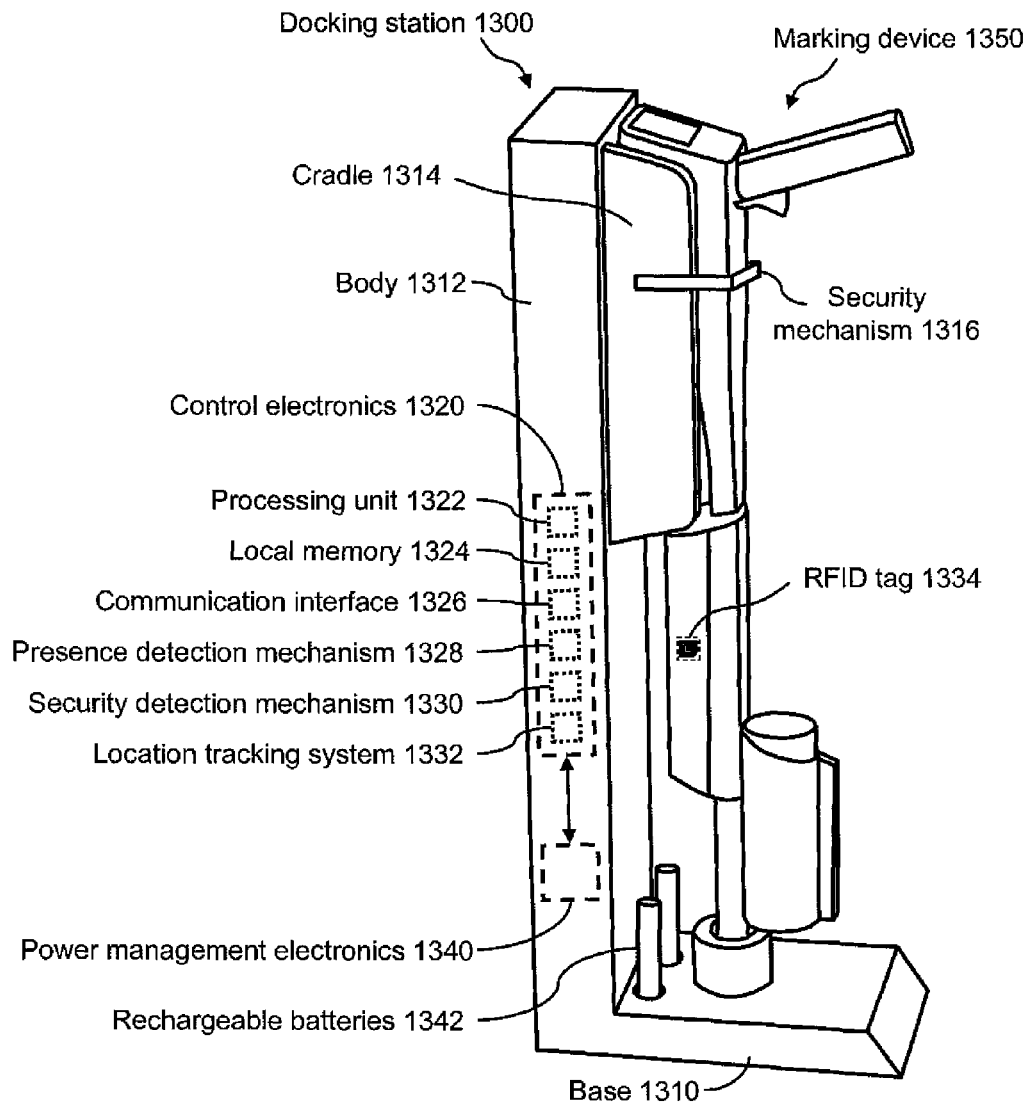
FIG. 17 is a perspective view of a marking device docking station that has processing and communications capability, in accordance with embodiments of the invention.

FIG. 17 is a perspective view of a marking device docking station 1300 that has processing and communications capability. Docking station 1300 may be installed in, for example, a vehicle and is suitable for use in conjunction with a marking device, such as marking device 1350. In other embodiments, docking station 1300 may be installed at a central facility, office or other fixed location. Thus, docking station 1300 may be mobile or fixed. Docking station 1300 may serve as a home base for storage of marking device 1350 and for charging the battery of marking device 1350. Marking device 1350 is, for example, an electronic marking device. In one example, marking device 1350 may be based on the electronic marking devices that are described above in connection with marking device 150.

Docking station 1300 may include a base 1310 and a body 1312. Additionally, a cradle 1314 is integrated into the upper end of body 1312 (the end opposite base 1310). Cradle 1314 provides a means to mechanically and electrically couple marking device 1350 to docking station 1300. Base 1310, body 1312, and cradle 1314 may be made of any suitably strong, rigid, and lightweight material, such as, but not limited to, molded plastic and metal. Additionally, docking station 1300 may include a security mechanism 1316 for holding and securing marking device 1350 into cradle 1314 in a lockable manner. For example, security mechanism 1316 may be a flexible strap or a rigid bracket that may be placed around the body of marking device 1350 and secured with a locking mechanism (not shown) to docking station 1300.

Docking station 1300 may also include control electronics for providing processing and communications capability to docking station 1300. For example, docking station 1300 may include control electronics 1320 that includes a processing unit 1322, a local memory 1324, a communication interface 1326, a presence detection mechanism 1328, a security detection mechanism 1330, and, optionally, a location tracking system 1332.

Processing unit 1322 may include any standard controller or microprocessor device that is capable of executing program instructions. Local memory 1324 may be any data storage mechanism for storing any information that is processed locally at docking station 1300. Processing unit 1322 and local memory 1324 may be used for managing the overall operations of docking station 1300.

Communication interface 1326 may include any wired and/or wireless communication interface for connecting to a network (not shown) and by which information may be exchanged with other computing devices that may be separate from docking station 1300 and/or with other docking stations 1300. Examples of wired communication interfaces may include, but are not limited to, USB ports, RS232 connectors, RJ45 connectors, Ethernet, and any combinations thereof. Examples of wireless communication interfaces may include, but are not limited to, an Intranet connection, Internet, Bluetooth® technology, Wi-Fi, Wi-Max, IEEE 802.11 technology, radio frequency (RF), Infrared Data Association (IrDA) compatible protocols, Local Area Networks (LAN), Wide Area Networks (WAN), Shared Wireless Access Protocol (SWAP), any combinations thereof, and other types of wireless networking protocols.

Presence detection mechanism 1328 may include any mechanism of control electronics 1320 that is capable of determining whether a marking device 1350 is present within cradle 1314. In one example, presence detection mechanism 1328 may be a radio frequency identification (RFID) reader that is able to read, for example, an RFID tag 1334 that is affixed to marking device 1350. When marking device 1350 is present in cradle 1314, the RFID reader is able to read information (e.g., a marking device ID) from RFID tag 1334, which indicates that marking device 1350 is present in docking station 1300. However, when marking device 1350 is not present in cradle 1314, the RFID reader is unable to read information from RFID tag 1334, which indicates that marking device 1350 is not present in docking station 1300.

In another example, presence detection mechanism 1328 may include circuitry for reading the state of a "presence signal," which may be an electronic signal that has one state (e.g., a logic high) when marking device 1350 is present and another state (e.g., a logic low) when marking device 1350 is not present. The "presence signal" may be generated based, for example, upon sensing an electrical connection (or not) between docking station 1300 and marking device 1350 at the interface of cradle 1314.

Security detection mechanism 1330 may include any mechanism of control electronics 1320 that is capable of determining whether security mechanism 1316 is engaged around marking device 1350 and locked. For example, presence detection mechanism 1328 may include circuitry for reading the state of a "locked signal," which may be an electronic signal that has one state (e.g., a logic high) when security mechanism 1316 is engaged and locked and another state (e.g., a logic low) when security mechanism 1316 is not engaged and locked.

In one example, the locking mechanism of security mechanism 1316 may include an electromagnetic locking mechanism (not shown) that may be engaged/disengaged by a user of docking station 1300. In this example, the "locked signal" may be generated based upon sensing the state of the electromagnetic locking mechanism. In another example, the locking mechanism of security mechanism 1316 may include an electromechanical locking mechanism (not shown) that may be engaged/disengaged by a user of docking station 1300. Again, the "locked signal" may be generated based upon sensing the state of the electromechanical locking mechanism.

Location tracking system 1332, which is optional in docking station 1300, may include any device that can determine its geographical location to a specified degree of accuracy. For example, location tracking system 1332 may include a global positioning system (GPS) receiver or a global navigation satellite system (GNSS) receiver. A GPS receiver may provide, for example, any standard format data stream, such as a National Marine Electronics Association (NMEA) data stream. Location tracking system 1332 may also include an error correction component (not shown), which may be any mechanism for improving the accuracy of the geo-location data.

With respect to docking station 1300 being a recharging station for one or more batteries (not shown) of marking device 1350, docking station 1300 may include power management electronics 1340. When marking device 1350 is present in docking station 1300, power management electronics 1340 provides a standard battery charging function. Power management electronics 1340 is also able to communicate to control electronics 1320 the charging state of the one or more batteries of marking device 1350, for example, 50% charged, 75% charged, and so on.

Optionally, receptacles may be integrated into base 1310 of docking station 1300 for accepting rechargeable batteries 1342, which may be spare rechargeable batteries for use in marking device 1350. In one example, FIG. 1 shows two receptacles for accepting two rechargeable batteries 1342. When at least one rechargeable battery 1342 is present in base 1310, power management electronics 1340 provides a standard battery charging function. Power management electronics 1340 is also able to communicate to control electronics 1320 the presence of and the charging state of any rechargeable batteries 1342.

In operation, under the control of processing unit 1322, any information acquired and/or generated by docking station 1300 may be stored in local memory 1324. For example, information about the presence and security of marking device 1350 at docking station 1300 may be logged in local memory 1324. Information about the charging state of the one or more batteries of marking device 1350 may be logged in local memory 1324. Information about the charging state of any rechargeable batteries 1342 in base 1310 may be logged in local memory 1324. The geo-location data from location tracking system 1332 may be logged in local memory 1324, and the like.

Additionally, when marking device 1350 is present in docking station 1300, any information about locate operations (hereafter called marking data) that is stored in marking device 1350 may be transferred from marking device 1350 to local memory 1324 of docking station 1300.

With respect to any of the aforementioned information, whether originating from docking station 1300 or from marking device 1350, communication interface 1326 may be used to exchange information between docking station 1300 and any other computing devices that may be separate from docking station 1300. Additionally, communication interface 1326 may be used to exchange information between docking station 1300 and any other docking stations 1300. Further, when, for example, marking device 1350 is in use in the field (i.e., not docked), communication interface 1326 may be used to exchange information wirelessly between docking station 1300 and marking device 1350. Docking station 1300 may communicate information regardless of whether a marking device 1350 is present. Examples of marking device docking station configurations and networks are described with reference to FIGS. 18 through 21.

Figure 18:
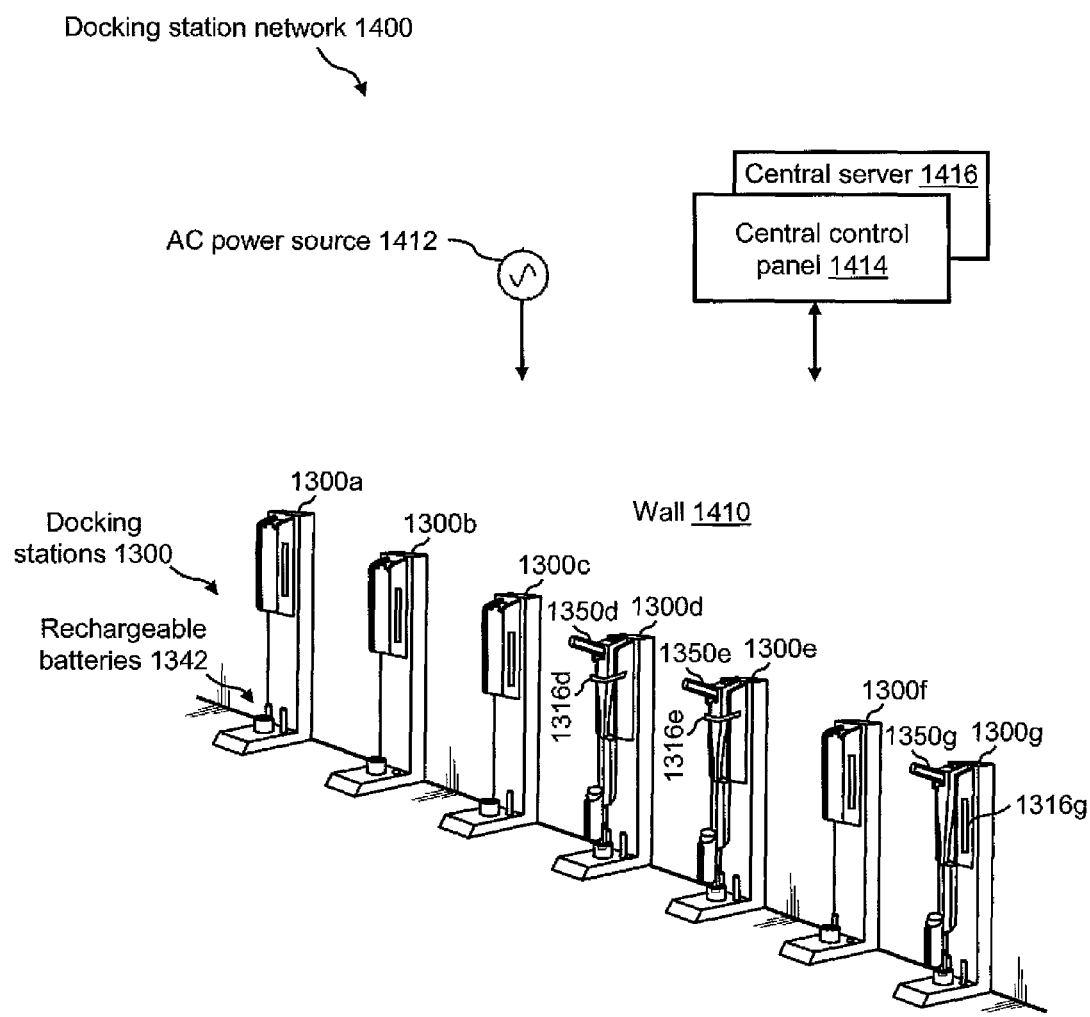
FIG. 18 is a schematic diagram of multiple fixed marking device docking stations in communication with a central computing device, which is one example of a docking station network, in accordance with embodiments of the invention.

FIG. 18 is a schematic diagram of a docking station network 1400, which is one example of a docking station network. In this example, docking station network 1400 may include multiple fixed marking device docking stations 1300 in communication with a central computing device.

In particular, FIG. 18 shows a bank of one or more docking stations 1300, which may be fixed and suitable for use with at least one marking device 1350 at, for example, a home base facility. The bank of docking stations 1300 may be floor-mounted along a wall 1410, as shown in FIG. 18. In another configuration, the bank of docking stations 1300 may be hung on a wall, free-standing on the floor, free-standing on a table, and any combinations thereof. In this configuration, the power source for each docking station 1300 may be designed and constructed to utilize an alternating current (AC) power source (e.g., an AC power source 1412). For example, a shielded power cord terminated in a three (3) prong plug may be used. The bank of docking stations 1300 may also be powered by direct current (DC) power sources (not shown). Each docking station 1300 allows a marking device, such as marking device 1350, to be attached and detached easily for charging and, where applicable, for data transfer.

In the configuration of docking station network 1400, the one or more docking stations 1300 are in communication with a central computing device. The central computing device may be, for example, a central control panel 1414 and/or a central server 1416. Docking stations 1300 may communicate with central control panel 1414 and/or central server 1416 via their respective communication interfaces 1326. Further, the communication of each docking station 1300 may be managed by its processing unit 1322. Central control panel 1414 and/or central server 1416 may be used to collect information from docking stations 1300, such as, but not limited to, marking device presence information, marking device security information, marking device battery status information, spare battery status information, marking data of marking devices, and the like. The information returned from docking stations 1300 may be useful, for example, for monitoring marking device inventory, monitoring marking device battery status, monitoring marking device security, monitoring spare battery inventory and status, collecting marking data, and so on.

By way of example and referring again to FIG. 18, by using the processing and communications capabilities of docking stations 1300a through 1300g, central control panel 1414 and/or central server 1416 may determine, log, and report the following:

a) no marking device 1350 is present in docking station 1300a, two rechargeable batteries 1342 are present in docking station 1300*a*, the first rechargeable battery 1342 is 100% charged, the second rechargeable battery 1342 is 100% charged;
b) no marking device 1350 is present in docking station 1300*b*, no rechargeable batteries 1342 are present in docking station 1300*b*;
c) no marking device 1350 is present in docking station 1300*c*, one rechargeable battery 1342 is present in docking station 1300*c*, the rechargeable battery 1342 is 78% charged;
d) a marking device 1350*d* is present in docking station 1300*d*, marking device 1350*d* is locked down and secure, the batteries of marking device 1350*d* are 100% charged, two rechargeable batteries 1342 are present in docking station 1300*d*, the first rechargeable battery 1342 is 100% charged, the second rechargeable battery 1342 is 100% charged;
e) a marking device 1350*e* is present in docking station 1300*e*, marking device 1350*e* is locked down and secure, the batteries of marking device 1350*e* are 67% charged, two rechargeable batteries 1342 are present in docking station 1300*e*, the first rechargeable battery 1342 is 82% charged, the second rechargeable battery 1342 is 74% charged;
f) no marking device 1350 is present in docking station 1300*f*, no rechargeable batteries 1342 are present in docking station 1300*f*;
g) a marking device 1350*g* is present in docking station 1300*g*, marking device 1350*g* is not locked down and secure, the batteries of marking device 1350*g* are 100% charged, two rechargeable batteries 1342 are present in docking station 1300*g*, the first rechargeable battery 1342 is 100% charged, the second rechargeable battery 1342 is 94% charged;
h) three of a possible seven marking devices 1350 are present and accounted for, two of the three present are fully charged, one of the three present is not fully charged; and
i) ten of a possible fourteen rechargeable batteries 1342 are present and accounted for, five of the ten present are fully charged, five of the ten present are not fully charged.

Figure 19:
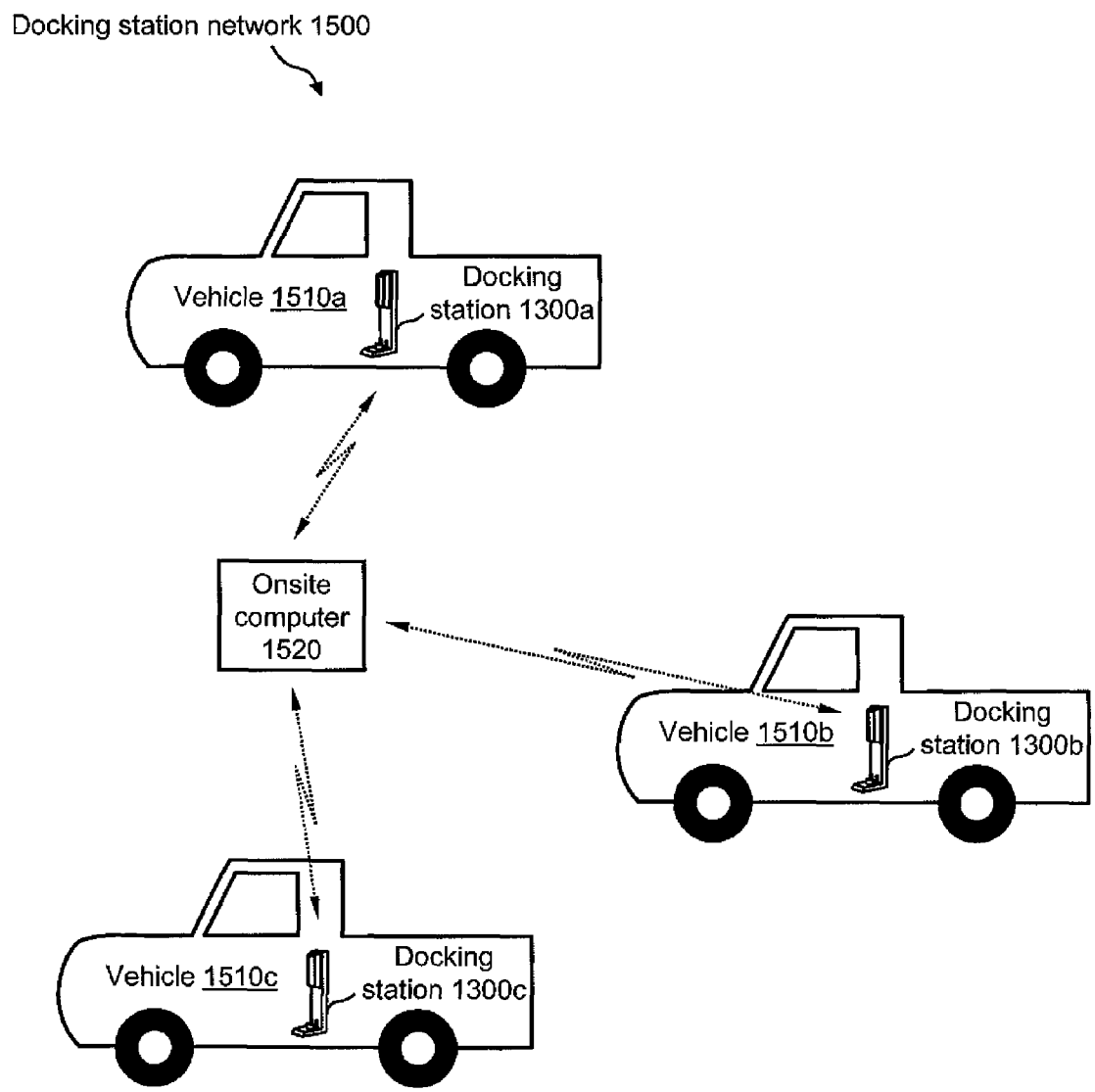
FIG. 19 is a schematic diagram of multiple mobile marking device docking stations in the field and in communication with an onsite computing device, which is another example of a docking station network, in accordance with embodiments of the invention.

FIG. 19 is a schematic diagram of a docking station network 1500, which is another example of a docking station network. In this example, docking station network 1500 may include multiple mobile marking device docking stations 1300 in the field and in communication with an onsite computing device. More specifically, FIG. 19 shows multiple vehicles 1510, such as a vehicle 1510*a*, 1510*b*, and 1510*c*. Installed in each vehicle 1510 is a docking station 1300. For example, installed in vehicles 1510*a*, 1510*b*, and 1510*c* are docking stations 1300*a*, 1300*b*, and 1300*c*, respectively. Vehicles 1510*a*, 1510*b*, and 1510*c* may be, for example, the vehicles of locate technicians that are dispatched to a jobsite in the field. Docking stations 1300*a*, 1300*b*, and 1300*c* are used to hold marking devices (not shown) in vehicles 1510*a*, 1510*b*, and 1510*c*. In this configuration, the power source for each docking station 1300 may be designed and constructed to utilize the DC power of a vehicle. Alternatively, instead of multiple docking stations 1300 in multiple vehicles 1510, there may be multiple docking stations 1300 in a one vehicle 1510.

In the configuration of docking station network 1510, the one or more docking stations 1300 are in communication with a central computing device. In one example, the central computing device may be an onsite computer 1520. Onsite computer 1520 may be any onsite computing device, such as, but not limited to, a laptop computer, a handheld computer, and a tablet device, that has network capability. In particular, onsite computer 1520 is capable of communicating with any docking stations 1300 within its range. In one example, onsite computer 1520 may be present in one of the vehicles 1510.

As described with reference to FIG. 18, by using the processing and communications capabilities of docking stations 1300*a*, 1300*b*, and 1300*c*, onsite computer 1520 may determine, log, and report, for example, marking device presence, marking device battery status, marking device security, spare battery presence and status, marking data from each marking device, and so on.

Figure 20:
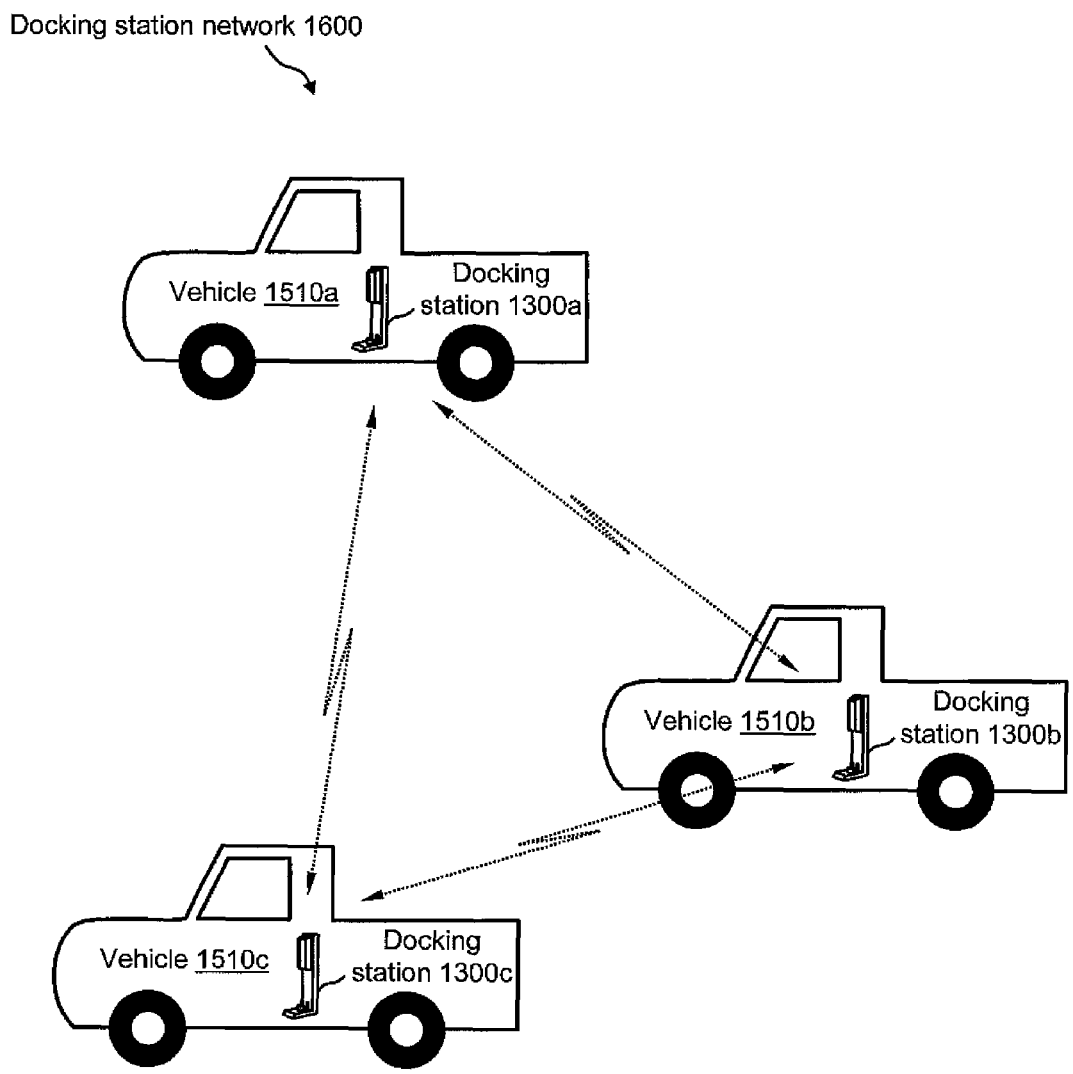
FIG. 20 is a schematic diagram of multiple mobile marking device docking stations in the field and in communication with each other, which is yet another example of a docking station network, in accordance with embodiments of the invention.

FIG. 20 is a schematic diagram of a docking station network 1600, which is yet another example of a docking station network. In this example, docking station network 1600 may include multiple mobile marking device docking stations 1300 in the field and in communication with each other. Docking station network 1600 is substantially the same as docking station network 1500 of FIG. 19, except that the multiple docking stations 1300 are communicating directly with each other instead of to a central computing device, such as onsite computer 1520 of FIG. 19.

With respect to docking station network 1600, any docking station 1300 may poll any other docking station 1300 to determine their status (i.e., peer-to-peer communication). This may be accomplished using communication interface 1326 of each docking station 1300, which may have short range wireless communication capability, such as Bluetooth®.

The configuration of docking station network 1600 may be useful, for example, to implement certain protocols with respect to performing locate operations. In one example, a project ticket calls for two locate technicians. Therefore, two vehicles 1510 with two docking stations 1300 (holding two marking devices), respectively, are present at the jobsite. In this example, a software rule may be implemented that once the locate operation is complete, the marking devices 1350 must be present in the respective docking stations 1300 before any data from either marking device 1350 is processed and before the ticket can be classified as complete. In order to accomplish this, there is communication between the two docking stations 1300 as to the presence of their respective marking devices 1350 and no data can be transferred until both are present. This may be useful to ensure a complete set of data to accompany the completed project ticket (i.e., eliminating any chance of partial data). Further, this scenario may ensure the association of data of the two marking devices involved. Any removal of either marking device in the middle of data transfer is communicated between the two docking stations 1300, which will stop data transfer of the remaining marking device.

Figure 21:
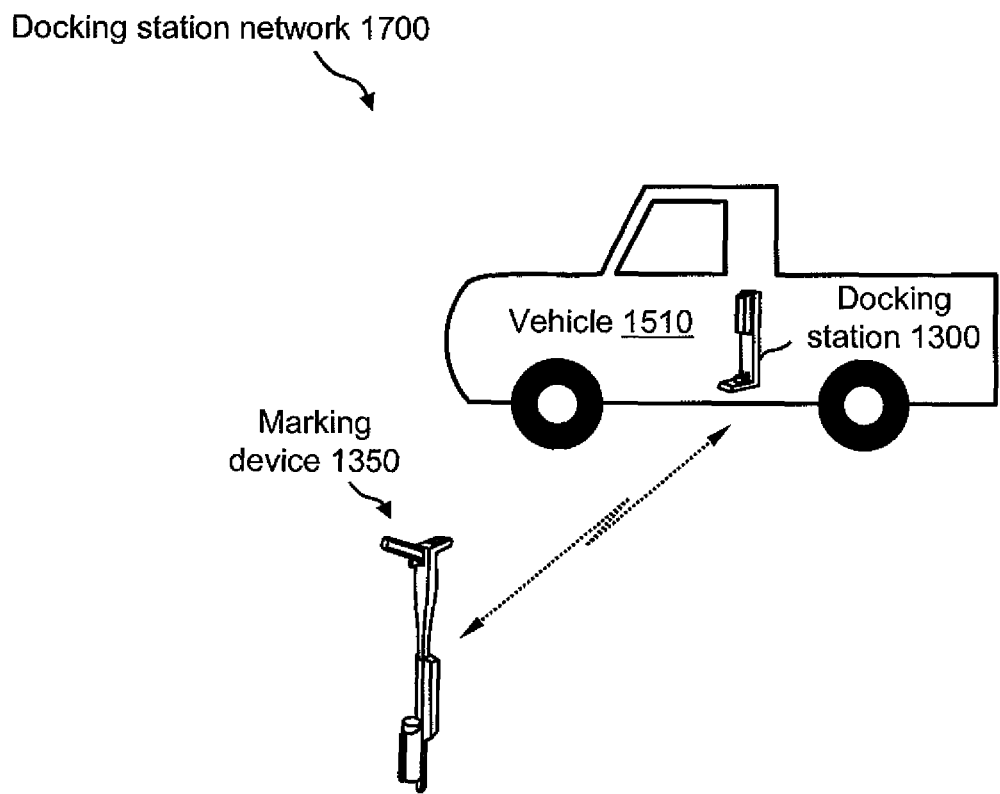
FIG. 21 is a schematic diagram of at least one marking device docking station in communication with at least one marking device, which is still another example of a docking station network, in accordance with embodiments of the invention.

FIG. 21 is a schematic diagram of a docking station network 1700, which is still another example of a docking station network. In this example, docking station network 1700 may include at least one marking device docking station 1300 in communication with at least one marking device 1350.

Docking station network 1700 is an example of using communication interface 1326 of docking station 1300 to exchange information wirelessly with a marking device 1350. The configuration of docking station network 1700 may be useful, for example, to implement certain protocols with respect to performing locate operations. In one example, docking station 1300 may receive a message from an external system via, for example, onsite computer 1520 of FIG. 19. This message is then flashed from docking station 1300 to its associated marking device 1350. The user of marking device 1350 receives the message at his/her marking device 1350 and may respond accordingly.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A docking station for docking a marking device of a type used to mark a presence or absence of an underground facility in a dig area, the docking station comprising:
a housing;
an electronic interface to transfer information to and from the marking device of the type used to mark the presence or absence of the underground facility in the dig area;
docking control electronics to control operation of the docking station; a user interface of the docking station to interact with a user; and
a local memory, communicatively coupled to the electronic interface and the docking control electronics, to store at least marking device information transferred from the marking device to the docking station.

2. A docking station as defined in claim 1, further comprising a communication interface to transfer marking device information to and from a computing device.

3. A docking station as defined in claim 1, wherein the docking control electronics is configured to store the marking device information in the local memory for later transfer to a computing device.

4. A docking station as defined in claim 1, wherein the docking control electronics is configured to control transfer of data to and between the marking device and a computing device.

5. A docking station as defined in claim 1, wherein the docking control electronics is configured to control data synchronization between the docking station and the marking device.

6. A docking station as defined in claim 1, further comprising a wired interface for wired communication between the docking station and a computing device.

7. A docking station as defined in claim 1, further comprising a wireless interface for wireless communication between the docking station and a computing device.

8. A docking station as defined in claim 1, further comprising a wired interface for wired communication between the docking station and the marking device.

9. A docking station as defined in claim 1, further comprising a wireless interface for wireless communication between the docking station and the marking device.

10. A docking station as defined in claim 1, wherein the user interface includes a touch screen to receive user inputs and to display information to a user.

11. A docking station as defined in claim 1, wherein the user interface includes a keypad to receive user inputs.

12. A docking station as defined in claim 1, wherein the user interface includes one or more light emitting devices.

13. A docking station as defined in claim 1, wherein the user interface includes a display device to display information associated with docking station operation.

14. A docking station as defined in claim 1, wherein the user interface includes one or more sound emitting devices.

15. A docking station as defined in claim 1, further comprising at least one control input to enable control of the docking station by a user.

16. A docking station as defined in claim 1, further comprising at least one indicator to indicate an operating condition of the docking station and/or the marking device.

17. A docking station as defined in claim 1, further comprising a control interface to receive control inputs from an external user interface.

18. A docking station as defined in claim 1, further comprising a timing system to generate a current date and time.

19. A docking station as defined in claim 18, wherein the docking control electronics is configured to record dates and times of docking and/or undocking of the marking device.

20. A docking station as defined in claim 18, wherein the docking control electronics is configured to record dates and times of docking station operations.

21. A docking station as defined in claim 18, wherein the docking control electronics is configured to record a date and time of testing, diagnostics and/or calibration of the marking device.

22. A docking station as defined in claim 1, further comprising a location tracking system to determine geographical coordinates of the docking station.

23. A docking station as defined in claim 22, wherein the docking control electronics is configured to record the geographical coordinates of the docking station upon docking and undocking of the marking device.

24. A docking station as defined in claim 22, wherein the docking control electronics is configured to record the geographical coordinates of the docking station during docking station operations.

25. A docking station as defined in claim 22, wherein the docking control electronics is configured to receive geographical coordinates of the marking device and to record the geographical coordinates of the marking device relative to the geographical coordinates of the docking station.

26. A docking station as defined in claim 1, wherein the docking control electronics is configured to execute a diagnostics routine for testing of the marking device.

27. A docking station as defined in claim 1, wherein the docking control electronics is configured to execute a diagnostics routine for testing of the docking station.

28. A docking station as defined in claim 1, wherein the docking control electronics is configured to execute a calibration routine for calibration of the marking device.

29. A docking station as defined in claim 1, further comprising a power interface to charge a battery in the marking device.

30. A docking station as defined in claim 29, wherein the docking control electronics is configured to determine a charge state of the battery in the marking device.

31. A docking station as defined in claim 29, wherein the docking control electronics is configured to record a date and time of battery charging.

32. A docking station as defined in claim 29, wherein the docking control electronics is configured to record geographical coordinates of battery charging.

33. A docking station as defined in claim 29, wherein the docking control electronics is configured to determine a battery quality and/or a battery capacity of the battery in the marking device.

34. A docking station as defined in claim 1, wherein the docking control electronics is configured to verify the identity of the marking device.

35. A docking station as defined in claim 34, wherein the docking control electronics is configured to verify an identity of the marking device by receiving an identification from the marking device and comparing the received identification with stored identifications of marking devices.

36. A docking station as defined in claim 35, wherein the docking control electronics is configured to generate an alert if the received identification does not match one of the stored identifications of marking devices.

* * * * *